US012082482B2

(12) United States Patent
Nakamura et al.

(10) Patent No.: US 12,082,482 B2
(45) Date of Patent: Sep. 3, 2024

(54) DISPLAY DEVICE AND MANUFACTURING METHOD THEREOF

(71) Applicant: SEMICONDUCTOR ENERGY LABORATORY CO., LTD., Atsugi (JP)

(72) Inventors: Daiki Nakamura, Kanagawa (JP); Kazuhiko Fujita, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/370,752

(22) Filed: Jul. 8, 2021

(65) Prior Publication Data
US 2021/0336168 A1 Oct. 28, 2021

Related U.S. Application Data

(63) Continuation of application No. 16/497,839, filed as application No. PCT/IB2018/051792 on Mar. 19, 2018, now Pat. No. 11,158,823.

(30) Foreign Application Priority Data

Mar. 31, 2017 (JP) .................. 2017-070206

(51) Int. Cl.
G09G 5/00 (2006.01)
H10K 50/842 (2023.01)
H10K 77/10 (2023.01)

(52) U.S. Cl.
CPC ....... *H10K 77/111* (2023.02); *H10K 50/8426* (2023.02)

(58) Field of Classification Search
CPC . G06F 1/1652; G06F 1/1656; H01L 27/3241; H01L 51/0097; H01L 51/5246;
(Continued)

(56) References Cited

U.S. PATENT DOCUMENTS 6,852,997 B2 2/2005 Yamazaki et al.
7,307,279 B2 12/2007 Yamazaki et al.
(Continued)

FOREIGN PATENT DOCUMENTS

CN 001420568 A 5/2003
CN 101996535 A 3/2011
(Continued)

OTHER PUBLICATIONS

International Search Report (Application No. PCT/IB2018/051792) dated Jun. 26, 2018.
(Continued)

*Primary Examiner* — Insa Sadio
(74) *Attorney, Agent, or Firm* — Fish & Richardson P.C.

(57) ABSTRACT

When a base film used in a flexible display panel is bonded to a resin member for fixing the base film that is curved, the base film has creases by an environmental change such as temperature due to difference in linear expansion coefficient before and after a thermal shock. A buffer plate that is thin enough to be bent is provided between the base film used in a flexible display panel and the resin member. With the use of heat dissipation effect and heat equalization effect of the buffer plate, a structure around the panel capable of resisting the environmental change can be provided.

18 Claims, 16 Drawing Sheets

(58) Field of Classification Search
CPC ........ H05B 33/12; H05B 33/14; H05B 45/60; H05B 47/00; Y02B 20/30; Y02E 10/549
See application file for complete search history.

(56) References Cited

U.S. PATENT DOCUMENTS

| | | |
|---|---|---|
| 8,736,162 B2 | 5/2014 | Jin et al. |
| 8,790,938 B2 | 7/2014 | Yamazaki et al. |
| 8,836,655 B2 | 9/2014 | Huang et al. |
| 9,099,678 B2 | 8/2015 | Yamazaki et al. |
| 9,372,559 B2 | 6/2016 | Kim |
| 9,406,903 B2 | 8/2016 | Yamazaki et al. |
| 9,448,592 B2 | 9/2016 | Jin et al. |
| 9,457,551 B2 | 10/2016 | Tsai et al. |
| 9,594,402 B2 | 3/2017 | Hiroki et al. |
| 9,713,271 B2 | 7/2017 | Hiroki et al. |
| 9,798,401 B2 | 10/2017 | Kim |
| 9,818,978 B2 | 11/2017 | Yamazaki et al. |
| 9,940,086 B2 | 4/2018 | Yoshizumi et al. |
| 10,054,988 B2 | 8/2018 | Jin et al. |
| 10,120,410 B2 | 11/2018 | Yamazaki et al. |
| 10,133,531 B2 | 11/2018 | Yoshitani et al. |
| 10,198,235 B2 | 2/2019 | Yoshizumi et al. |
| 10,222,825 B2 | 3/2019 | Wang et al. |
| 10,289,158 B2 | 5/2019 | Hiroki et al. |
| 10,437,283 B2 | 10/2019 | Yamazaki et al. |
| 10,474,186 B2 | 11/2019 | Yamazaki et al. |
| 10,528,084 B2 | 1/2020 | Jin et al. |
| 10,572,211 B2 | 2/2020 | Yoshizumi et al. |
| 10,613,579 B2 | 4/2020 | Wang et al. |
| 10,983,564 B2 | 4/2021 | Jin et al. |
| 11,093,204 B2 | 8/2021 | Yoshizumi et al. |
| 11,112,821 B2 | 9/2021 | Yamazaki et al. |
| 11,567,724 B2 | 1/2023 | Yoshizumi et al. |
| 2002/0105279 A1 | 8/2002 | Kimura |
| 2003/0201974 A1 | 10/2003 | Yin |
| 2005/0285811 A1 | 12/2005 | Kawase et al. |
| 2007/0201248 A1* | 8/2007 | Jung ................. G02F 1/133308 362/561 |
| 2011/0050657 A1 | 3/2011 | Yamada |
| 2011/0057861 A1* | 3/2011 | Cok ................. H10K 59/18 345/1.3 |
| 2011/0115693 A1* | 5/2011 | Kim .................. G09G 3/3208 345/76 |
| 2012/0011752 A1 | 1/2012 | Schutte |
| 2012/0218503 A1 | 8/2012 | Tsai et al. |
| 2012/0229390 A1 | 9/2012 | Huang et al. |
| 2014/0183473 A1 | 7/2014 | Lee et al. |
| 2014/0204074 A1 | 7/2014 | Kimura |
| 2015/0028316 A1* | 1/2015 | Kojima ............... H01L 51/0097 257/40 |
| 2015/0228704 A1 | 8/2015 | Miyake et al. |
| 2016/0037608 A1 | 2/2016 | Ikeda et al. |
| 2016/0064466 A1 | 3/2016 | Son et al. |
| 2016/0103649 A1 | 4/2016 | Yoshitani et al. |
| 2016/0132281 A1 | 5/2016 | Yamazaki et al. |
| 2016/0210103 A1 | 7/2016 | Yoshizumi et al. |
| 2016/0351848 A1 | 12/2016 | Kodama et al. |
| 2017/0092703 A1 | 3/2017 | Bae. et al. |
| 2017/0148826 A1 | 5/2017 | Choi |
| 2017/0347471 A1 | 11/2017 | Hiroki et al. |
| 2019/0102136 A1 | 4/2019 | Yoshitani et al. |
| 2019/0163433 A1 | 5/2019 | Yoshizumi et al. |
| 2019/0265751 A1 | 8/2019 | Hiroki et al. |
| 2021/0240228 A1 | 8/2021 | Jin et al. |
| 2022/0050496 A1 | 2/2022 | Yamazaki et al. |
| 2023/0176802 A1 | 6/2023 | Yoshizumi et al. |

FOREIGN PATENT DOCUMENTS

| | | |
|---|---|---|
| CN | 102356419 A | 2/2012 |
| CN | 102681229 A | 9/2012 |
| CN | 103258839 A | 8/2013 |
| CN | 103309499 A | 9/2013 |
| CN | 103545321 A | 1/2014 |
| CN | 103809317 A | 5/2014 |
| CN | 104885140 A | 9/2015 |
| CN | 105807557 A | 7/2016 |
| CN | 106058074 A | 10/2016 |
| CN | 106201058 A | 12/2016 |
| CN | 106537485 A | 3/2017 |
| CN | 206022364 U | 3/2017 |
| CN | 106796769 A | 5/2017 |
| EP | 2639677 A | 9/2013 |
| EP | 2939228 A | 11/2015 |
| EP | 3064987 A | 9/2016 |
| JP | 62-136875 A | 6/1987 |
| JP | 2003-345286 A | 12/2003 |
| JP | 2007-272107 A | 10/2007 |
| JP | 2011-047976 A | 3/2011 |
| JP | 2011-047977 A | 3/2011 |
| JP | 2013-015835 A | 1/2013 |
| JP | 2013-021357 A | 1/2013 |
| JP | 2013-242493 A | 12/2013 |
| JP | 2014-063159 A | 4/2014 |
| JP | 2015-038868 A | 2/2015 |
| JP | 2015-187858 A | 10/2015 |
| JP | 2016-159903 A | 9/2016 |
| JP | 2016-167045 A | 9/2016 |
| JP | 2016-167049 A | 9/2016 |
| JP | 2016-173461 A | 9/2016 |
| JP | 2016-224165 A | 12/2016 |
| KR | 2014-0085956 A | 7/2014 |
| KR | 2017-0060215 A | 6/2017 |
| KR | 2017-0065559 A | 6/2017 |
| TW | 424273 | 3/2001 |
| TW | I234750 | 6/2005 |
| TW | 201237697 | 9/2012 |
| TW | I432838 | 4/2014 |
| TW | 201626352 | 7/2016 |
| TW | 201640465 | 11/2016 |
| TW | 201701248 | 1/2017 |
| WO | WO-2014/104711 | 7/2014 |
| WO | WO-2016/055897 | 4/2016 |

OTHER PUBLICATIONS

Written Opinion (Application No. PCT/IB2018/051792) dated Jun. 26, 2018.

Chinese Office Action (Application No. 201880021323.5) dated Apr. 6, 2021.

Taiwanese Office Action (Application No. 107110554) dated Oct. 25, 2021.

Taiwanese Office Action (Application No. 111137734) dated Jun. 16, 2023.

Chinese Office Action (Application No. 202210143780.X) dated Jul. 6, 2024.

* cited by examiner

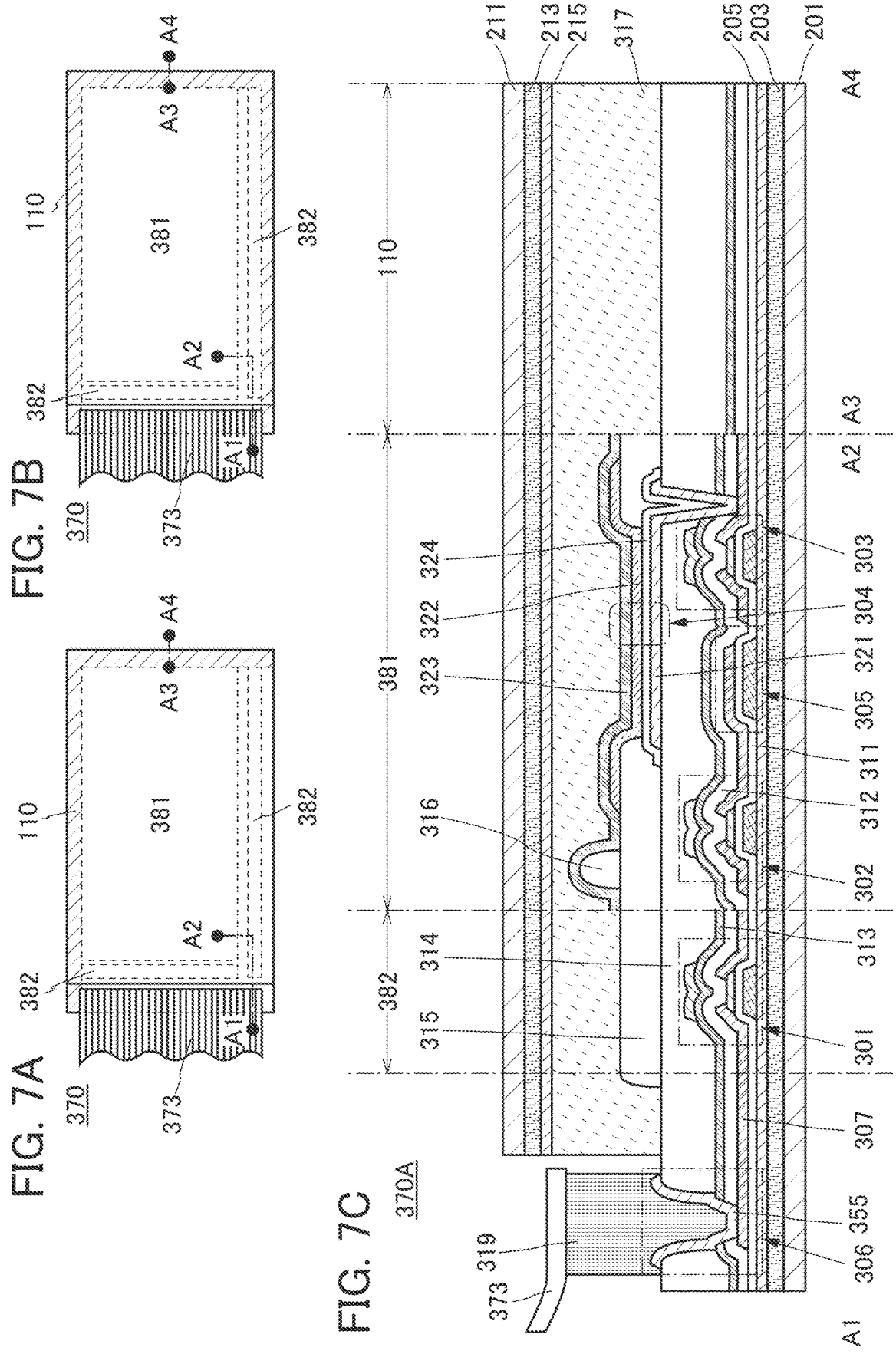

DISPLAY DEVICE AND MANUFACTURING METHOD THEREOF

CROSS REFERENCE TO RELATED APPLICATIONS

This application is a continuation of U.S. application Ser. No. 16/497,839, filed Sep. 26, 2019, now allowed, which is incorporated by reference and is a U.S. National Phase Application under 35 U.S.C. § 371 of International Application PCT/IB2018/051792, filed on Mar. 19, 2018, which is incorporated by reference and claims the benefit of a foreign priority application filed in Japan on Mar. 31, 2017, as Application No. 2017-070206.

TECHNICAL FIELD

One embodiment of the present invention relates to a display device for displaying images or a lighting device.

Note that one embodiment of the present invention is not limited to the technical field. The technical field of one embodiment of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a display device, a light-emitting device, a lighting device, a power storage device, a storage device, a method for driving any of them, and a method for manufacturing any of them.

Note that in this specification, a semiconductor device generally means a device that can function by utilizing semiconductor characteristics. An electrooptic device, a semiconductor circuit, and an electronic device are all semiconductor devices.

BACKGROUND ART

In recent years, it has been required to increase display devices in size and type. A television device with waterproof function for enjoying video display anywhere in home, for example, in the kitchen or bath, is widely used. A television device for home use (also referred to as TV or television receiver), digital signage, a public information display (PID), and the like are also widely used. Larger digital signage, PID, and the like provide more information and attract more attention when used for advertisement or the like, so that the effectiveness of the advertisement is expected to be increased.

Most of the popular television devices are liquid crystal display devices using glass substrates.

Examples of display devices alternative to the liquid crystal display device include, typically, a light-emitting device including a light-emitting element such as an organic electroluminescent (EL) element or a light-emitting diode (LED), and electronic paper performing display by an electrophoretic method or the like. These display devices can be formed using not a glass substrate but a lightweight and thin plastic film (also referred to as plastic sheet).

For example, an organic EL element has a basic structure in which a layer containing a light-emitting organic compound is provided between a pair of electrodes. By voltage application to the organic EL element, the light-emitting organic compound can emit light. With use of such an organic EL element, thin, lightweight, high-contrast, and low-power-consumption display devices can be achieved.

Development is advanced so that a measuring instrument in a car or the like is partly replaced with a liquid crystal display device. Approaches to supporting a driver at a vehicle such as a car by displaying more information (e.g., information on the situation, traffic information, and geographic information around the car) have been taken.

An opportunity to see a liquid crystal display device in public transportation such as a train and bus has been increasing.

Patent Document 1 discloses a display device in which a battery (the exterior body is an aluminum thin film) is provided between a bent belt-shaped holding structure body and a flexible display panel.

Patent Document 2 discloses a wristband-type display device in which a printed circuit board and a battery is provided between a bent belt-shaped holding structure body and a flexible display panel.

Patent Document 3 discloses a display device including a bent flexible display panel.

REFERENCE

Patent Document

[Patent Document 1] Japanese Published Patent Application No. 2015-38868
[Patent Document 2] Japanese Published Patent Application No. 2015-187858
[Patent Document 3] Japanese Published Patent Application No. 2016-167049

DISCLOSURE OF INVENTION

One object is to provide an electronic device having a novel structure. Specifically, provided is an electronic device having a novel structure that can be mounted on various places, for example, inside vehicles.

A flexible display panel is formed over a thin flexible film and performs display with an organic light-emitting element. The thin flexible film is soft and can be hung as a poster. However, when an optical film such as a polarization film is bonded on the display surface, warpage or distortion might occur.

A thin flexible display panel can be incorporated as it is in a housing of a device, a car, or a wall, but is preferably fixed to a member. When the member has a curved surface at least partly, different impression from the design of a conventional display device can be given. The member for fixing the flexible display panel can be referred to as housing.

If there is a big difference in thermal coefficient (hereinafter referred to as linear expansion coefficient) between the flexible film and the material of the member to be fixed, creases might occur due to environment changes. For example, when the member is formed of acrylic, there is a difference in the linear expansion coefficient between acrylic (linear expansion coefficient of acrylic is about $7 \times 10^{-5}/°$ C.) and the flexible film (linear expansion coefficient of the PET is about $17.1 \times 10^{-5}/°$ C.), and creases might occur. In addition, warpage and creases might occur by heat generated by the display panel and elements in the vicinity thereof and by change in atmospheric pressure.

When the change in the use environment, for example, the temperature rise in a car and temperature decrease due to an air conditioner in the summer are repeated in a state where the materials with different linear expansion coefficients are fixed with an adhesive material, a double-sided tape or the like, the thermal strain caused by the difference in linear expansion coefficient is applied and the state of the material changes. For example, when a display panel including a flexible film is fixed to a member to be mounted with an adhesive material or a double-sided tape, the shape of the flexible film is changed by repetition of thermal shock, so that the quality of the display panel is reduced. In view of this, a buffer plate for improving heat dissipation and reducing stress applied to the flexible film regardless of such repetition of thermal shock is provided between the flexible film and the member of the display panel.

For example, a display panel using a flexible film is mounted on a car dashboard as a member. The car dashboard can be formed of a polypropylene resin (linear expansion coefficient of a PP resin is from about $10 \times 10^{-5}$/° C. to $12 \times 10^{-5}$/° C.), an ABS resin (linear expansion coefficient of an ABS resin is from about $7 \times 10^{-5}$/° C. to $13 \times 10^{-5}$/° C.), an acrylonitrile-styrene resin, a urethane resin, or the like. The dashboard formed of any of the materials has a curved surface. When the display panel is bonded to the member along the curved surface, one surface of a buffer plate is provided on the curved surface of the member and then the display panel is bonded to the other surface of the buffer plate, so that the display panel is capable of resisting heat shock.

One embodiment of the present invention is a display device including an organic light-emitting element over a film formed of a first organic resin material, a member formed of a second organic resin material having a different linear expansion coefficient from that of the first organic resin material, and a buffer plate. The member has a curved surface partly and has regions with different thicknesses. The buffer plate is provided on the curved surface of the member. A film formed of the first organic resin material is provided on the buffer.

The buffer plate has a thickness of 0.1 mm or more and 2.5 mm or less, preferably 1 mm or less, which is thin enough to be bent along the curved surface of the member. A curved surface of a housing is fixed to a metal film with an adhesive material or a double-sided tape. The metal film is also fixed to a base film of the flexible display panel with an adhesive material or a double-sided tape.

The buffer plate can be formed of stainless steel (linear expansion coefficient of stainless steel is about $17.3 \times 10^{-6}$/° C.), aluminum (linear expansion coefficient of aluminum is about $23 \times 10^{-6}$/° C.) copper (linear expansion coefficient of copper is about $16.8 \times 10^{-6}$/° C.), silver (linear expansion coefficient of silver is about $18.9 \times 10^{-6}$/° C.), gold (linear expansion coefficient of gold is about $14.3 \times 10^{-6}$/° C.), iron (linear expansion coefficient of iron is about $11.7 \times 10^{-6}$/° C.), titanium (linear expansion coefficient of titanium is about $8.4 \times 10^{-6}$/° C.), molybdenum (linear expansion coefficient of molybdenum is about $4.9 \times 10^{-6}$/° C.), tungsten (linear expansion coefficient of tungsten is about $4.3 \times 10^{-6}$/° C.), platinum (linear expansion coefficient of platinum is about $9 \times 10^{-6}$/° C.), or an alloy of these material. This specification is based on evaluation of the average linear expansion coefficient in a certain temperature range obtained by using a thermal mechanical analysis method (TMA method). However, in the case where the thickness or mechanical strength of the film is small, the film shape might be changed by any cause other than heat and cannot be analyzed correctly by the conventional TMA method. Note that depending on the material, the linear expansion coefficient might change from the temperature at which glass transition occurs, for example.

The display device further includes a printed circuit board including a driver circuit. The buffer plate and the member are provided between the printed circuit board and the film formed of the first organic resin material. The printed circuit board is electrically connected to an organic light-emitting element with a flexible printed circuit board therebetween.

A device having a curved display portion tends to be large because of its curved surface. In particular, when a printed circuit board mounted with a driver IC and the like is provided on the rear side of a flexible display panel to reduce the device size, for example, the device can be compact in size and the printed circuit board also serves as a fixing member. The buffer plate can function as a shield when a high-frequency circuit which is likely to generate electromagnetic noise is used in a printed circuit board. In the case where a buffer plate is used as a shield, the buffer plate is preferably set to a ground potential.

In each of the above structures, the member can be formed of acrylic, polypropylene, polyvinyl chloride, polycarbonate, polyamide, or the like. The member formed of a resin material might expand by absorbing moisture depending on the resin material.

The member may have a slit or a thin part (a groove, a hollow, or the like) to reduce the weight or to have flexibility.

The member may be composed of a plurality of parts. A guide portion and the member may be formed of different materials. For example, a guide portion is provided between a printed circuit board and a flexible display panel to prevent breakage by overload at a bend portion of the flexible printed circuit board. The flexible printed circuit board may be broken or be disconnected from an external terminal by physical overload when deformed by being pressed against another part.

A guide portion is provided so that the flexible printed circuit board can be compact to be stored. The orientation of the flexible display panel is partly changed along the guide portion to be connected to the flexible printed circuit board so that the flexible printed circuit board is connected to a printed circuit board, whereby the flexible printed circuit board can be prevented from jutting from the display panel. Although it is one solution that the length of the flexible printed circuit board is minimized, there is an excessive length in consideration of a manufacture margin. The excessive length curls jutting from the flexible printed circuit board. Also when stored in a housing, the flexible printed circuit board has an undesired curl and twist.

Another embodiment of the present invention is a display device including an organic light-emitting element over a film formed of an organic resin material, a terminal electrically connected to the organic light-emitting element, a flexible printed circuit board in contact with and connected to the terminal, and a printed circuit board connected to the flexible printed circuit board. One part of the film formed of the organic resin material overlaps with a member having a flat surface with a buffer provided therebetween and is substantially parallel to the printed circuit board. The other part of the film overlaps with the guide portion. A flat surface of the guide portion is substantially perpendicular to the flat surface of the member. The flat surface of the guide portion overlaps with a portion where the flexible printed circuit board is in contact with the terminal. A curved surface of the guide portion has a curvature radius of 5 mm or more.

Note that in this embodiment, a film is a thin film-shaped material having a thickness of 200 μm or less and mainly formed of a polymer raw material. In general, a film-shaped material having a thickness of more than 200 μm is referred to as sheet to distinguish from a film. However, in this specification, a film-shaped material having a thickness of less than 0.5 mm and mainly formed of a polymer raw material is referred to as a film.

A metal plate used as the buffer plate may be referred to as foil when having a small thickness. For example, the thickness of an aluminum foil is 0.006 mm or more and 0.2 mm or less in the Japanese Industrial Standard (JIS). A film which is formed of a polymer raw material and on which a metal material such as aluminum is deposited may be referred to as aluminum laminate film and can be used for a buffer plate.

Images are displayed on a flexible display panel using a storage capacitor connected to an organic light-emitting element. When a flexible film with a small thickness of 100 μm or less overlaps with an element group such as a printed circuit board, distortion of display images might be caused by impact on the storage capacitor. For this reason, the shortest distance between the element including the organic light-emitting element and an electrode of the printed circuit board is at least 150 μm or more. If the shortest distance between the element including the organic light-emitting element and an electrode of the printed circuit board is less than 150 μm, distortion of display images occurs.

The light-emitting elements for different colors preferably include separate light-emitting layers. A display device of one embodiment of the present invention is composed of a plurality of display panels, and each display panel can have a relatively small size. Thus, the alignment accuracy of a metal mask is high, leading to higher yield in separate coloring. Accordingly, the display device has an advantage when employing light-emitting elements that are formed by a separate coloring method.

The light-emitting elements may have either a bottom-emission structure or a top-emission structure. It is particularly preferable to use top-emission light-emitting elements.

In addition, a flexible display panel can be incorporated along a curved inside/outside wall surface of a house or building or along a curved interior/exterior surface of a car. For example, a member having a desired shape is formed using a 3D printer, a buffer plate is provided between the member and the flexible display panel, so that display regions can be provided in a variety of regions. When a 3D printer is used, an ABS resin, a PLA resin, or an epoxy resin is used for the member.

When the display device is incorporated in a car, the influence by temperature stress is preferably reduced. The structure of the present invention is effective particularly in a car where the display device easily reaches high heat. The weight reduction is achieved as compared with the case of mounting a conventional liquid crystal display device. In addition, since a glass substrate, which is used in the liquid crystal display device, is not used, there is no concern about hurting passengers.

A display device with a novel structure that can be mounted on various places, such as the interior of a vehicle can be provided.

When the display device is provided in the interior of a car, a display region with a large area for a user such as a driver and information displayed on the display region with a large area is used by the driver in safe driving.

BRIEF DESCRIPTION OF DRAWINGS

FIGS. 7A to 7C are top views and a cross-sectional view illustrating an example of a display panel.

BEST MODE FOR CARRYING OUT THE INVENTION

Hereinafter, embodiments of the present invention will be described in detail with reference to the accompanying drawings. Note that one embodiment of the present invention is not limited to the description below, and it is easily understood by those skilled in the art that modes and details of the present invention can be modified in various ways. The present invention should not be construed as being limited to the description in the embodiments given below.

Embodiment 1

In this embodiment, structure examples and application examples of a display device of one embodiment of the present invention are described with reference to drawings.

To fix a flexible display panel to part of a housing having a curved surface, a buffer plate formed of a member having a curved surface and metal is provided between the flexible display panel and the housing. For example, in a car, the housing is part of a dashboard, and the dashboard includes the mounted display panel in this specification. The dashboard means the whole interior components (including the meter and the display device) around the front of the driver's seat below the front window, and is also referred to as instrument panel.

Figure 1:
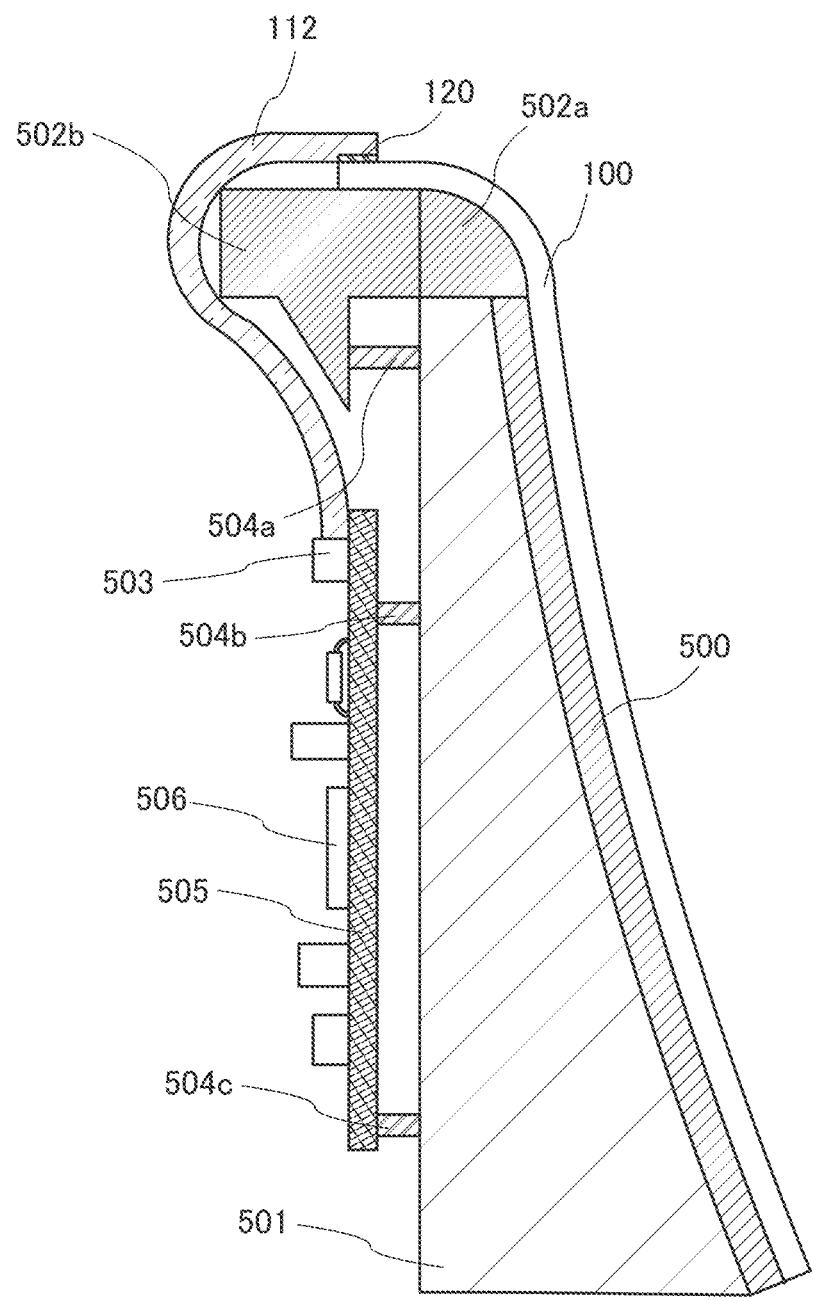
FIG. 1 is a schematic cross-sectional view illustrating a display device according to one embodiment of the present invention.

FIG. 1 is a cross-sectional view illustrating an example of a member 501 having a curved surface provided with a display panel 100.

The display device illustrated in FIG. 1 includes the member 501 having a curved surface, a buffer plate 500, the display panel 100, a flexible printed circuit board (FPC) 112, a printed circuit board 505, and guide portions 502a and 502b.

In the case where an organic resin film and an organic light-emitting element are respectively used for a substrate and a display element of the display panel 100 and the film thickness is reduced, the total thickness in a display region of the display panel 100 can be less than or equal to 1 mm.

In the case where a touch panel is provided so that the display panel 100 has a touch input function as well, the display panel 100 needs to be supported by the member 501 overlapping with the display panel 100 so that the user can touch the display panel. The member 501 for supporting the display panel 100 is formed of a hard material having repulsive force with respect to the finger touch. The use of such a material can prevent the display panel 100 from being broken by the finger touch.

The member 501 is formed using acrylic, polypropylene, polyvinyl chloride, polycarbonate, polyamide, or the like. Such organic resins are preferably used, in which case the weight of the display device can be reduced.

When the member 501 and the film of the display panel 100 are fixed to be in contact with each other, creases occur by a change in temperature due to difference in linear expansion coefficient of the materials.

Figure 16A:
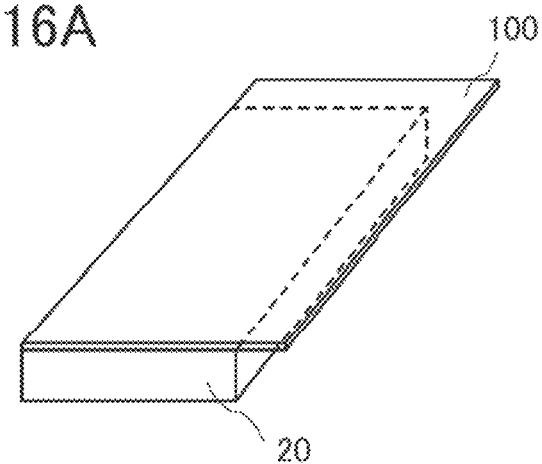
FIGS. 16A to 16C are a cross-sectional view of a sample structure for experiment and photographs of the experiment results (comparative example).
Figure 16B:
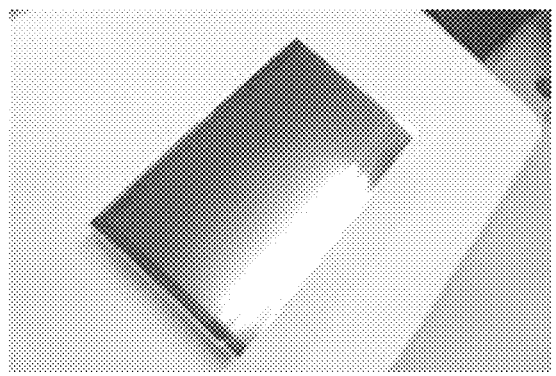
Figure 16C:
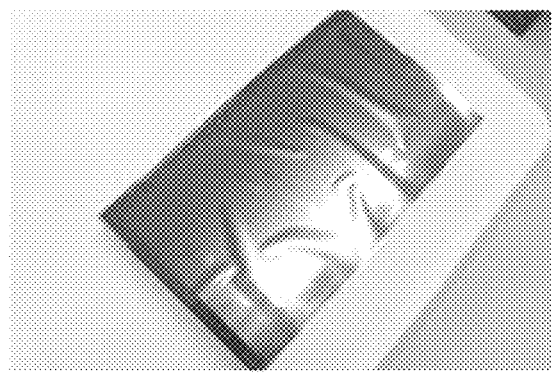

FIG. 16A shows a cross-sectional perspective view of a sample in which the display panel 100 is bonded to be in contact with an acrylic flat plate 20 with a double-sided tape. FIGS. 16B and 16C show results of preservation test in which thermal shock is given. FIG. 16B is a photograph taken just after the display panel 100 is bonded to be in contact with the flat acrylic plate 20. FIG. 16C is a photograph taken after preservation at 40° C. for 12 hours, after preservation at 0° C. for 12 hours, and after returning to the room temperature. As shown in FIG. 16C, creases occur and the appearance is largely changed after the preservation test.

In view of the above results, in this embodiment, as illustrated in FIG. 1, the buffer plate 500 is provided between the member 501 having a curved surface and the display panel 100. Although not illustrated in FIG. 1, a bonding layer such as a double-sided tape is provided between the member 501 and the buffer plate 500.

The thickness of the buffer plate 500 is more than or equal to 0.1 mm and less than or equal to 2.5 mm. The mechanical treatment is preferably performed depending on the material to have a shape along the surface of the member 501. In this embodiment, aluminum which is lightweight and inexpensive is used, and an aluminum plate having a thickness of 0.5 mm is used. With such a thickness, the aluminum plate can be flexible so that it can be formed into a shape along the curved surface of the member when bonded to the member 501 with a double-sided tape.

The buffer plate 500 can suppress occurrence of creases due to thermal shock as shown in FIG. 16C. The buffer plate 500 formed using an aluminum plate can also be referred to as heat buffering plate and can disperse and equalize or dissipate heat generated by an element and the like of the display panel 100. In the case where external force is applied from the outside, stress applied to the member 501 and the display panel 100 may be relieved with the buffer plate 500.

If the member 501 is formed of the same metal material as the buffer plate 500 and the buffer plate is not provided, occurrence of creases due to thermal shock can be suppressed; however, the total weight of the member 501 is increased and the weight of the display device is increased.

In the case where the display device is incorporated in a car, the display device is fit into a frame which is fixed into another frame with a screw or the like for maintaining the rigidity of the car body, or the display device is fixed into a frame with a screw. In that case, if the weight of the display device is large, the load is concentrated on the frame to which the display device is fixed. For this reason, the weight of the display device including the member 501 is preferably small. In a car, the installation position needs to be considered to keep weight balance. Therefore, a lightweight display device using the flexible display panel is useful because there is no need to consider the installation position.

A region of the display panel 100 in FIG. 1 overlapping with the buffer plate has the center of curvature on the right side, which is a curved surface having a radius of curvature of greater than 700 mm. The other region has the center of curvature on the left side, which is a curved surface having a smaller radius of curvature. The curved surface having a smaller radius of curvature is supported by the guide portion 502a not to have a radius of curvature of less than 5 mm. The display panel 100 can have enough reliability of display when the radius of curvature is greater than or equal to 5 mm.

In the display panel 100 in FIG. 1, a terminal electrode 120 is electrically connected to a display element and the FPC 112. The flat surface of the guide portion 502b overlaps with a contact portion between the FPC 112 and the terminal electrode 120. The display panel 100 and the FPC 112 are provided along the outer side of the guide portions 502a and 502b.

As illustrated in FIG. 1, the display device in which the printed circuit board 505 provided with a driver IC 506 is provided on the rear side of the display panel 100 can be compact in size.

The guide portion 502b is fixed to the guide portion 502a. A flat portion of the guide portion 502b may be formed of a metal material. The guide portion 502b may have a portion in contact with the FPC 112, and the contact portion is not necessarily rounded as in FIG. 1 because the FPC 112 is flexible. In FIG. 1, the guide portion 502b is fixed to the member 501 with a fastener 504a such as a bolt or screw.

The printed circuit board 505 includes an element group such as the driver IC 506 and is fixed to the member 501 with the fastener 504b and 504c. The flat surfaces of the printed circuit board 505 and the member 501 are substantially parallel to each other. Note that the FPC 112 is connected to a connection portion 503 of the printed circuit board 505. The power may be supplied to the display device through a connection cord from a power supply (e.g., a power generator or a secondary battery) of a vehicle. The printed circuit board 505 may be provided with a secondary battery, a wireless communication portion, or the like, and may have a system configuration for transmitting and receiving a video signal wirelessly.

The member 501 may have a chipped portion or a cavity for further reduction in weight. To further reduce the size, the member 501 may have a complex shape, specifically, a shape in which a region overlapping with a printed circuit board 505 hollowed out so that a distance between the printed circuit board 505 and the buffer plate 500 is reduced.

When the element provided for the printed circuit board 505 is a high-frequency circuit or the like, the buffer plate 500 preferably functions as an electric-field shielding film. The buffer plate 500 can reduce degradation in display quality of the display panel 100 due to noise from the high-frequency circuit. In order to reduce the influence of noise, the shortest distance between the printed circuit board and the organic light-emitting element is preferably 150 μm or more.

When a conductive plate is provided to be partly in contact with and overlap with a flexible film overlapping with the display region of the display panel, the degradation in display quality of the display panel 100 is reduced.

Therefore, the region of the buffer plate 500 overlapping with the display region of the display panel 100 is preferably at least the same as or larger than the area of the display region of the display panel 100. If there is a portion where the display region of the display panel 100 does not overlap with the buffer plate 500, a boundary might appear on the display by a difference in image displayed between them.

The cross-sectional shape of the member 501 is not particularly limited to the example in FIG. 1 as long as having a curved surface. For example, a cross-sectional shape of the member 501 illustrated in FIG. 2 may be used. Since the cross-sectional shape of the member 501 in FIG. 2 is different from that in FIG. 1, the shapes of the buffer plate 500 and the display panel 100 are also different; however, other structures are the same, and thus the detailed description is omitted.

Figure 2:
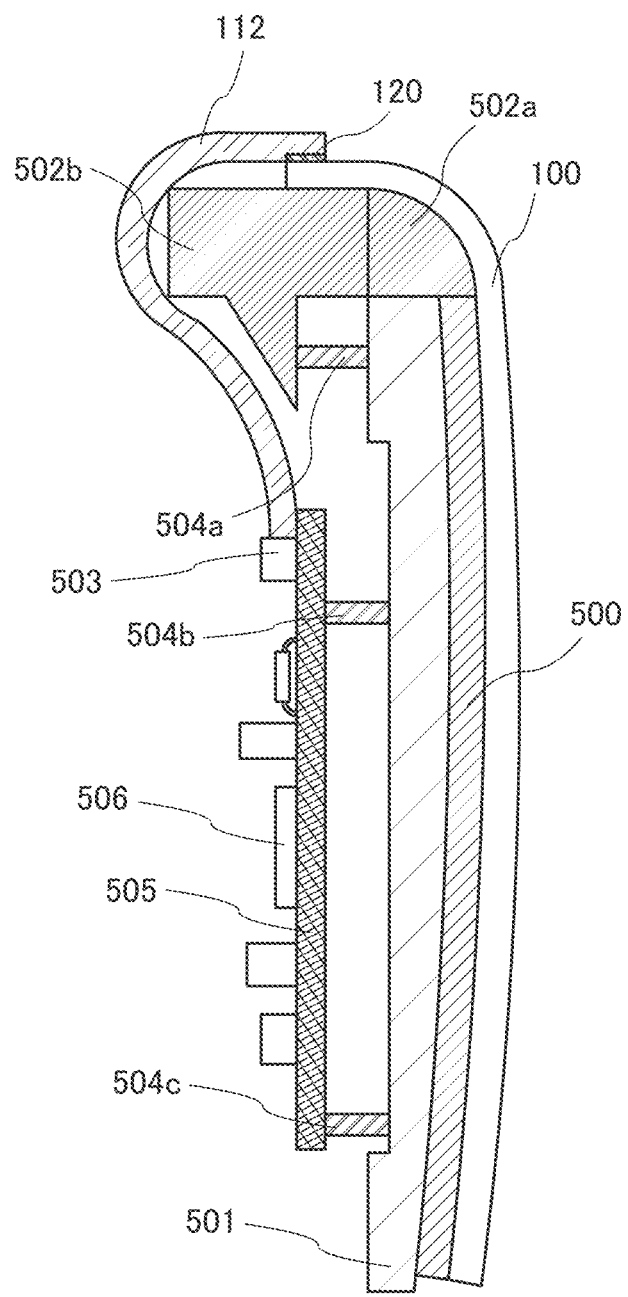
FIG. 2 is a schematic cross-sectional view illustrating another example of one embodiment of the present invention.

The member 501 in FIG. 2 has a smaller volume and lighter weight than the member 501 in FIG. 1. In addition, in the member 501 in FIG. 2, a region overlapping with the printed circuit board 505 is removed to achieve further reduction in weight. The member 501 having such a complex shape can be easily formed using a 3D printer or the like.

The display device described in this embodiment is effectively used in not only a vehicle but also a portable television receiver.

Figure 3A:
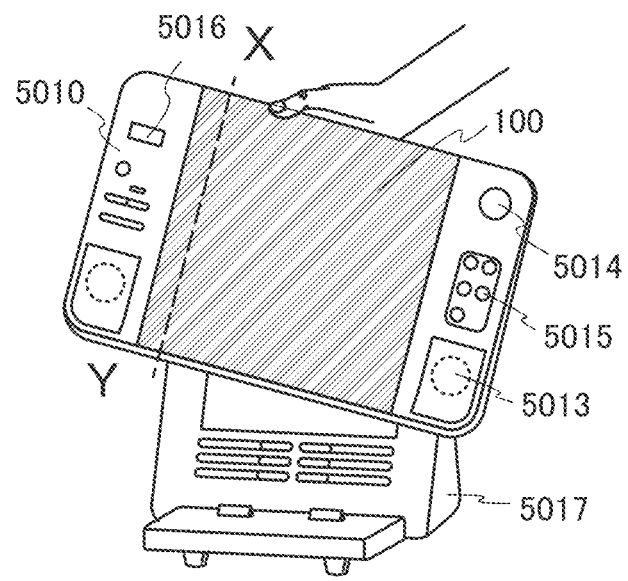
FIGS. 3A and 3B are a perspective view and a cross-sectional view illustrating a display device of one embodiment of the present invention.
Figure 3B:
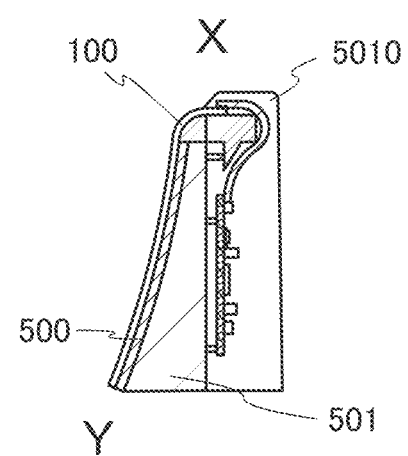

FIG. 3A illustrates an example of a portable television receiver 5010. FIG. 3B is a cross-sectional view taken along a dotted line X-Y in FIG. 3A. The portable television receiver 5010 includes a speaker 5013, an LED lamp 5014, operation keys 5015, and a connection terminal 5016. The portable television receiver 5010 can be set in a charger 5017 capable of transmitting and receiving signals as illustrated in FIG. 3A. In addition to these components, the portable television receiver 5010 includes an antenna, a tuner, an image processing portion, a memory medium reading portion, a secondary battery, and the like.

Requirements for a portable television are a large screen, being lightweight, and wide variety of installation positions. A conventional portable television has a flat liquid crystal display panel using a glass substrate. In that case, the backlight having the same size as the glass substrate and a large base is needed, and thus the base becomes larger as the screen size increases to maintain balance.

It is difficult to install the television having a large base in a narrow position, for example, a shelf with a small width.

As illustrated in FIG. 3B, the display element of this embodiment is an organic light-emitting element, and thus a backlight is not necessary. In addition, the ground surface side of the member 501 is wide and thus stable to maintain balance. The member 501 formed using an acrylic resin is lightweight. The display panel 100 is exposed to temperature shock when installed in a bathroom or the like; however, generation of creases or the like can be suppressed owing to the buffer plate 500 between the member 501 and the display panel 100.

The curved screen of the display panel 100 is easily viewable for the user.

A liquid crystal panel is formed using a glass substrate and thus can be broken when it falls. In contrast, the display panel 100 described in this embodiment is safe because it is formed using a flexible film and thus is not broken when it falls and is safe. Furthermore, the curved surface has almost no contact with a flat floor or desk when the display panel 100 falls thereon.

The shape of the member 501 is adjusted appropriately, whereby the display device described in this embodiment can be reduced in size and weight and installed in various places such as the inside of a vehicle. Thus, the display device can be compact and stored in a narrow space.

Application examples in which the display device described in this embodiment is installed in a vehicle are described below.

Figure 4A:
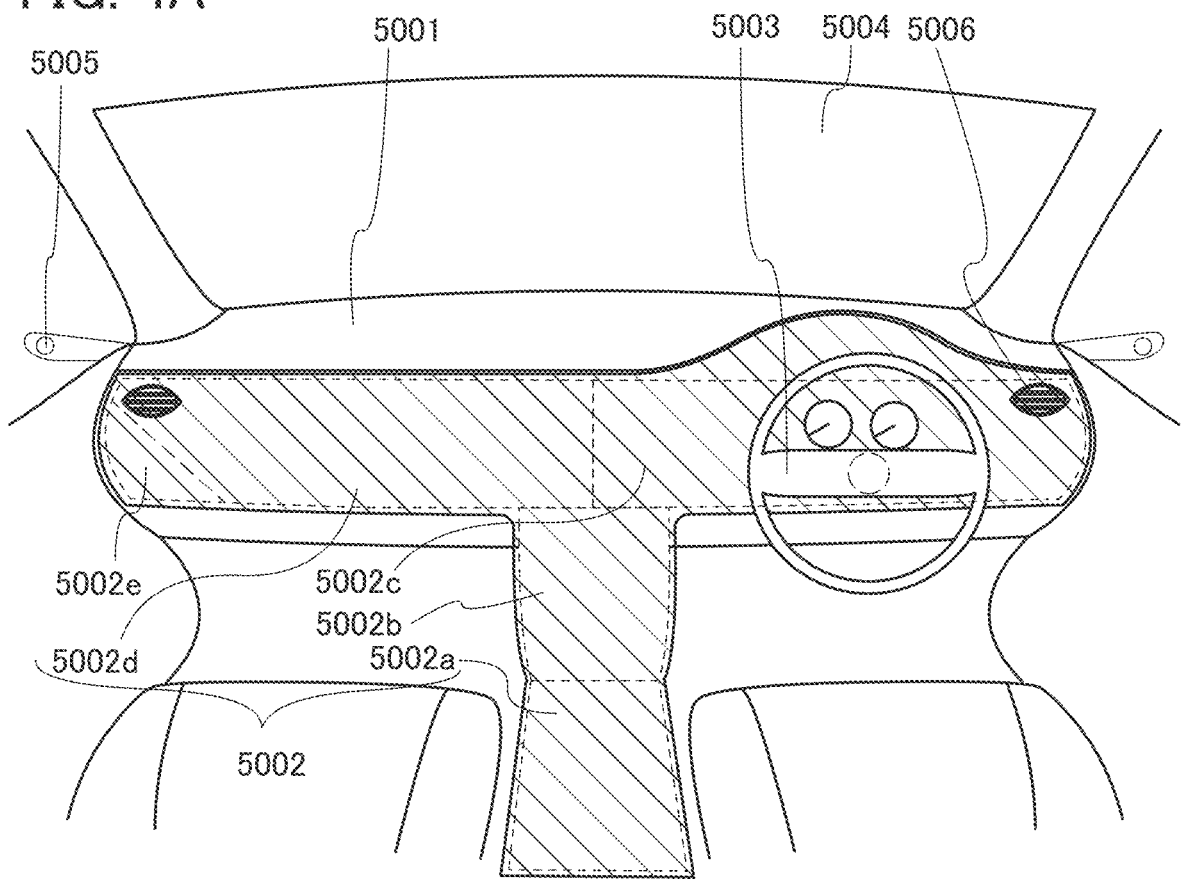
FIGS. 4A and 4B illustrate car mounting examples of a display device of one embodiment of the present invention.

FIG. 4A illustrates an example of installing a display device 5002 to a right-hand vehicle, but there is no particular limitation. In the case of a left-hand vehicle, the placement of the left and right is replaced.

FIG. 4A illustrates a dashboard 5001, a handle 5003, a windshield 5004, and the like which are arranged around a driver's seat and a front passenger's seat.

The display device 5002 is arranged in a predetermined position in the dash board 5001, specifically, around the driver, and is substantially T shape. The substantial T shape is preferable because a display region can be arranged in front of the driver's seat, in front of the front passenger's seat, and between the driver's seat and front passenger's seat in the car. FIG. 4A illustrates an example in which a plurality of display panels are combined into one display device 5002 and arranged on the curved or flat surface of the dashboard 5001; however, one embodiment of the present invention is not limited to the example, and a plurality of display devices may be separately provided. The one display device 5002 illustrated in FIG. 4A has a complex shape which includes a plurality of openings and does not include display regions in a handle connection portion, a display portion of a meter, a ventilation duct 5006, and the like. It is an advantage of a flexible display panel to enable such a complex shape.

A plurality of cameras 5005 for shooting the situation on the rear side are provided outside the car. Although the camera 5005 is provided instead of a side mirror in the example of FIG. 4A, both the side mirror and the camera may be provided.

The camera 5005 can be a CCD camera or a CMOS camera, or an infrared camera may be combined to them. The infrared camera can detect or extract a living body such as a human or animal because as the temperature of the object increases, the output level increases.

An image taken with the camera 5005 can be output to the screen of the display device 5002 (one or some of the display regions 5002*a*, 5002*b*, 5002*c*, and 5002*d*). Note that the display device 5002 is broadly divided into the four display regions and is composed of four display panels. For example, the display region 5002*a* corresponds to one display panel. In this embodiment, the display device illustrated in FIG. 1 is used for the display region 5002*b*, and the display device illustrated in FIG. 2 is used for the display regions 5002*a* and 5002*b*.

The display device 5002 is mainly used for drive support. The situation on the rear side is taken at a wide angle of view in the horizontal direction by the camera 5005, and the image is displayed so that the driver can see a blind area for avoiding an accident.

In the display regions 5002*a*, 5002*b*, 5002*c*, and 5002*d*, the use of a display system including a correction circuit having a function of correcting a video signal using artificial intelligence (AI) is preferable to display a seamless image in which a seam between adjacent display regions is inconspicuous. Specifically, a correction circuit capable of correcting a video image so that discontinuity of an image at the seam between the regions can be relieved by learning of an artificial neural network (ANN) is used. Inference (recognition) is made by the ANN after the learning, whereby a video signal is corrected to compensate for discontinuity of an image. This makes it possible to display the image in which a seam is inconspicuous, so that the quality of a high-resolution image can be improved.

Since the display device 5002 of the flexible display region 5002d is flexible, the angle of a screen of part of the display region 5002d can be changed to an angle easy for the driver to see by bending a left-edge portion 5002e using a position adjuster. It is hard to see the edge of the display region 5002d for the driver due to the distance and viewing angle. However, the left-edge portion 5002e of the display region 5002d is bent to have an angle the driver can see at a position suitable for a display region where an image of a side mirror is displayed in the car, which is useful.

A distance image sensor may be provided over a roof or the like of the car to display an obtained image on the display device 5002. As the distance image sensor, an image sensor or a light detection and ranging (LIDAR) is used. When an image obtained by a distance image sensor and an image obtained by a CCD camera are displayed on a large display area of a display device, more information can be provided to support the driver.

When the display device 5002 also displays map information, traffic information, television image, DVD image, and the like, more display panels are preferably combined to increase the display area of the display device. For example, map information can be displayed on a larger screen where the display regions 5002a, 5002b, 5002c, and 5002d are combined into one screen.

In the display regions 5002a, 5002b, 5002c, and 5002d, the image display regions are not particularly determined and can be freely changed to meet the driver's preference. For example, television image and DVD image are displayed in the display region 5002d on the left, map information is displayed in the display region 5002b at the center position, meters are displayed in the display region 5002c on the right, audio information are displayed in the display region 5002a near a transmission gear between the driver's seat and the front passenger's seat. Owing to the combination of a plurality of display panels, a fail-safe display device can be provided. For example, even when any one of the display panels is broken for any reason, display regions can be changed so that a display panel in the other region can be alternatively used.

The installation position is limited and there is dead space between the display panel and a curved surface of the interior car body, so that the in-car space is narrowed. Flexible display panels are preferably used for the display regions 5002a, 5002b, 5002c, and 5002d, since the display panels can be installed along the curved surface of the interior car body, so that the in-car space is hardly narrowed. Note that a flat display panel may be provided in combination with a flexible display panel as long as the in-car space is not narrowed so much. For example, the display region 5002a may be a flat display panel. Alternatively, the display region 5002a that the driver can reach may be a touch panel so that the driver can perform input operation.

Figure 4B:
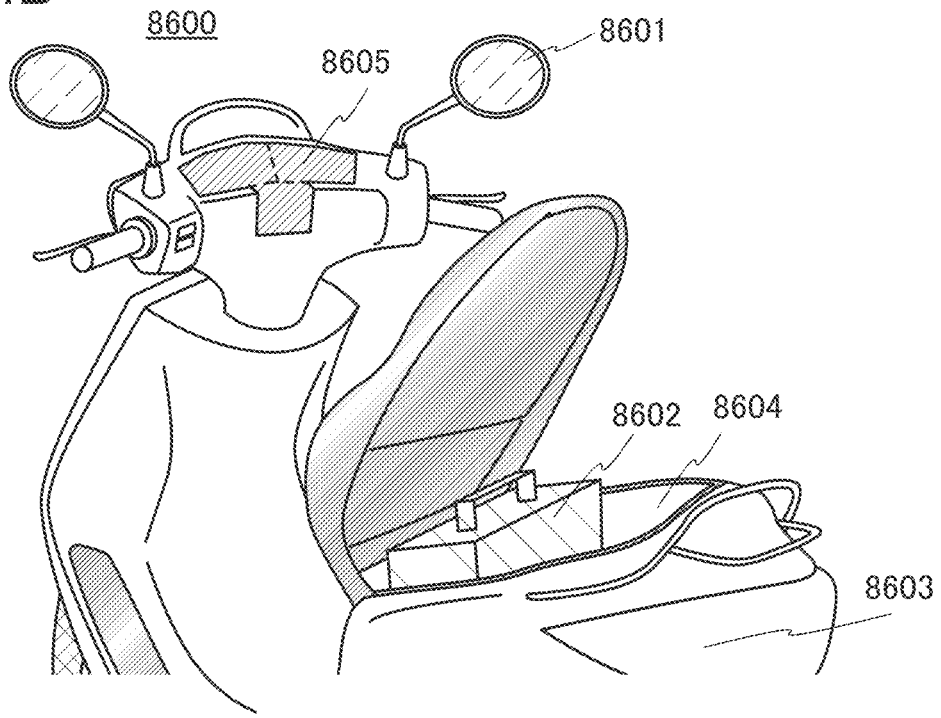

Although an example of a vehicle is described in this embodiment, one embodiment of the present invention is not limited thereto and can be used as a display device around a cockpit in an aircraft, a digital signage mounted on a cylindrical column, or can be incorporated along a curved surface of the inner or outer wall of a house or building. As illustrated in FIG. 4B, a display device 8605 may be provided around a handle bar of a bicycle (a motor scooter, for example). Three panels are combined into one T-shaped display device as the display device 8605. A motor scooter 8600 illustrated in FIG. 4B includes a secondary battery 8602, side mirrors 8601, and indicators 8603. The secondary battery 8602 can supply electric power to the indicators 8603. In the motor scooter 8600 illustrated in FIG. 4B, the secondary battery 8602 can be held in a storage unit under seat 8604. The secondary battery 8602 can be held in the storage unit under seat 8604 even with a small size. The secondary battery 8602 is detachable, can be carried indoors when charged, and be stored before the motorcycle is driven.

Embodiment 2

In this embodiment, a method for manufacturing the display panel 100 illustrated in FIG. 1A of one embodiment of the present invention will be described with reference to FIGS. 5A to 5F. The display panel 100 includes a display region 101 and a region 110 transmitting visible light that is adjacent to the display region 101. In a region 120, for example, a wiring electrically connected to the pixels included in the display region 101 is provided. In addition to the wiring, driver circuits (such as a scan line driver circuit and a signal line driver circuit) for driving the pixels may be provided. Furthermore, in the region 120, a terminal electrically connected to the FPC 112 (also referred to as a connection terminal), a wiring electrically connected to the terminal, an IC chip, and the like may be provided.

Figure 5A:
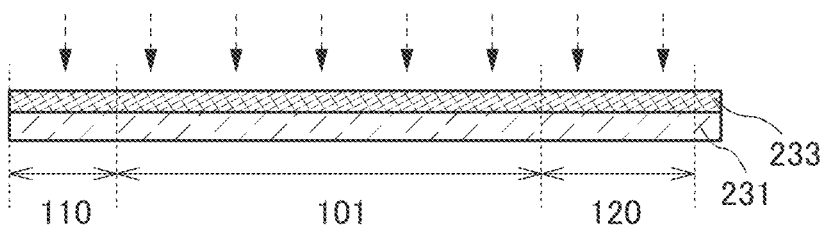
FIGS. 5A to 5G are cross-sectional views illustrating an example of a method for manufacturing a display panel.

First, as illustrated in FIG. 5A, a separation layer 233 is formed over a formation substrate 231. Then, plasma treatment is performed on a surface of the separation layer 233 (see the arrows indicated by dotted lines in FIG. 5A). Note that in this specification, a layer formed over a separation layer may be referred to as a layer to be separated.

As the formation substrate 231, a substrate having at least heat resistance high enough to withstand process temperature in a fabrication process is used. As the formation the substrate 231, for example, a glass substrate, a quartz substrate, a sapphire substrate, a semiconductor substrate, a ceramic substrate, a metal substrate, or a plastic substrate can be used.

Note that it is preferable to use a large-sized glass substrate as the formation substrate 231 in terms of productivity. For example, a glass substrate having a size greater than or equal to the 3rd generation (550 mm×650 mm) and less than or equal to the 10th generation (2950 mm×3400 mm) or a glass substrate having a larger size than the 10th generation is preferably used.

In the case where a glass substrate is used as the formation substrate 231, a base film is preferably formed between the formation substrate 231 and the separation layer 233 because contamination from the glass substrate can be prevented. Examples of the base film include insulating films such as a silicon oxide film, a silicon oxynitride film, a silicon nitride film, and a silicon nitride oxide film.

As the separation layer 233, an inorganic material can be used. Examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon. A crystal structure of a layer containing silicon may be amorphous, microcrystal, or polycrystal. The separation layer 233 is preferably formed using a high-melting point metal material such as tungsten, titanium, or molybdenum, in which case the degree of freedom of the process for forming the layer to be separated can be increased.

In the case where the separation layer 233 has a single-layer structure, a tungsten layer, a molybdenum layer, or a layer containing a mixture of tungsten and molybdenum is preferably formed. Note that the mixture of tungsten and molybdenum corresponds to an alloy of tungsten and molybdenum, for example.

The separation layer 233 can be formed by, for example, a sputtering method, a chemical vapor deposition (CVD) method (e.g., a plasma CVD method, a thermal CVD method, or a metal organic CVD (MOCVD) method), an atomic layer deposition (ALD) method, a coating method (e.g., a spin coating method, a droplet discharge method, or a dispensing method), a printing method, or an evaporation method.

The thickness of the separation layer 233 is greater than or equal to 1 nm and less than or equal to 1000 nm, preferably greater than or equal to 1 nm and less than or equal to 200 nm, further preferably greater than or equal to 10 nm and less than or equal to 100 nm.

In the case where the separation layer 233 is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film.

Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment can be performed in an atmosphere of oxygen, nitrogen, or nitrous oxide alone, or a mixed gas of any of these gasses and another gas.

Surface condition of the separation layer 233 is changed by the plasma treatment or heat treatment, whereby adhesion between the separation layer 233 and the insulating film formed later can be controlled. A case where plasma treatment is performed is described in this embodiment as an example.

Plasma treatment is preferably performed under an atmosphere containing nitrous oxide, further preferably under an atmosphere containing nitrous oxide and silane. Thus, an oxide layer of a material included in the separation layer 233 can be formed on the surface of the separation layer 233. In particular, when plasma treatment is performed under an atmosphere containing silane, an oxide layer with a very small thickness can be formed. The oxide layer with an extremely small thickness is not easily observed in a cross-sectional observation image.

The oxide layer contains an oxide of the material contained in the separation layer. In the case where a metal is included in the separation layer 233, the oxide layer contains an oxide of the metal contained in the separation layer 233. The oxide layer preferably contains tungsten oxide, titanium oxide, or molybdenum oxide.

Figure 5B:
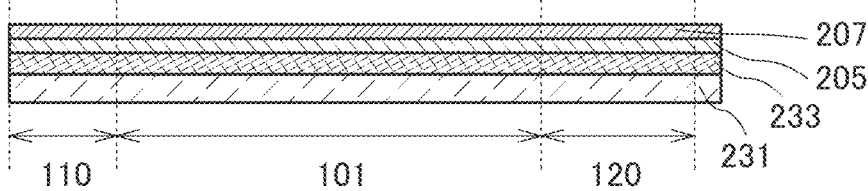

Next, as illustrated in FIG. 5B, the first insulating layer 205 is formed over the separation layer 233, and the second insulating layer 207 is formed over the first insulating layer 205.

Each of the first insulating layer 205 and the second insulating layer 207 can be a single layer or a multilayer using a silicon nitride film, a silicon oxynitride film, a silicon oxide film, a silicon nitride oxide film, or the like.

Note that in this specification, "silicon oxynitride" contains more oxygen than nitrogen. Moreover, in this specification, "silicon nitride oxide" contains more nitrogen than oxygen.

The first insulating layer 205 preferably contains oxygen and silicon. The first insulating layer 205 preferably has a single-layer structure of a silicon oxide film or a silicon oxynitride film.

It is preferable that the first insulating layer 205 further contain hydrogen. The first insulating layer 205 has a function of releasing hydrogen in a later heating step. Hydrogen is released from the first insulating layer 205 by heating, whereby hydrogen is supplied to the oxide layer. The first insulating layer 205 may further have a function of releasing hydrogen and nitrogen in the later heating step. When nitrogen is released from the first insulating layer 205 by heating, nitrogen is supplied to the oxide layer.

The first insulating layer 205 preferably includes a region in which the hydrogen concentration measured by secondary ion mass spectrometry (SIMS) is greater than or equal to $1.0 \times 10^{20}$ atoms/cm$^3$ and less than or equal to $1.0 \times 10^{22}$ atoms/cm$^3$, preferably greater than or equal to $5.0 \times 10^{20}$ atoms/cm$^3$ and less than or equal to $5.0 \times 10^{21}$ atoms/cm$^3$.

The first insulating layer 205 preferably includes a region in which the nitrogen concentration measured by SIMS is greater than or equal to $5.0 \times 10^{20}$ atoms/cm$^3$ and less than or equal to $1.0 \times 10^{23}$ atoms/cm$^3$, further preferably greater than or equal to $1.0 \times 10^{21}$ atoms/cm$^3$ and less than or equal to $5.0 \times 10^{22}$ atoms/cm$^3$.

In particular, for the first insulating layer 205, a silicon oxide film or a silicon oxynitride film is preferably formed by a plasma CVD method using a deposition gas containing a silane gas and a nitrous oxide gas, in which case a large amount of hydrogen and nitrogen can be contained in the film. In addition, the proportion of the silane gas in the deposition gas is preferably higher, in which case the amount of hydrogen released from the film in a later heating step is increased.

The second insulating layer 207 preferably contains nitrogen and silicon. The second insulating layer 207 preferably has a single-layer structure of a silicon nitride film or a silicon nitride oxide film or a stacked-layer structure including a silicon nitride film or a silicon nitride oxide film. In the case where the second insulating layer 207 has a stacked-layer structure, the second insulating layer 207 preferably further includes at least one of a silicon oxide film and a silicon oxynitride film.

The second insulating layer 207 has a function of blocking hydrogen released from the first insulating layer 205 in a later heating step. The second insulating layer 207 may be a film that can block hydrogen and nitrogen. The second insulating layer 207 can suppress supply of the hydrogen (and nitrogen) from the first insulating layer 205 to the element layer. In addition, the hydrogen (and nitrogen) can be supplied to the oxide layer efficiently. Another layer may be provided between the first insulating layer 205 and the second insulating layer 207.

A silicon nitride film included in the second insulating layer 207 is preferably formed by a plasma CVD method using a deposition gas containing a silane gas, a nitrogen gas, and an ammonia gas.

The first insulating layer 205 and the second insulating layer 207 can be formed by a sputtering method, a plasma CVD method, a coating method, a printing method, or the like. For example, each of the first insulating layer 205 and the second insulating layer 207 is formed at a temperature higher than or equal to 250° C. and lower than or equal to 400° C. by a plasma CVD method, whereby each of the first insulating layer 205 and the second insulating layer 207 can be a dense film having an excellent moisture-resistant property. Note that each of the first insulating layer 205 and the second insulating layer 207 is preferably formed to have a thickness of greater than or equal to 10 nm and less than or equal to 3000 nm, further preferably greater than or equal to 200 nm and less than or equal to 1500 nm.

Next, the separation layer 233, the first insulating layer 205, and the second insulating layer 207 are heated. Note that the heat treatment may be performed after at least part of the element layer 209 is formed. For example, the heat treatment may be performed after the transistor is formed and before the display element is formed. In the case where a heating step is included in the process for fabricating the element layer 209, the heating step may serve as the heat treatment.

By the heat treatment, hydrogen (and nitrogen) is released from the first insulating layer 205 to be supplied to the oxide layer. At this time, the second insulating layer 207 blocks the released hydrogen (and nitrogen); thus, hydrogen (and nitrogen) can be efficiently supplied to the oxide layer.

The oxide in the oxide layer is reduced by hydrogen supplied to the oxide layer, so that many kinds of oxides with different proportions of oxygen are mixed in the oxide layer. For example, in the case where tungsten is included in the separation layer, $WO_3$ formed by plasma treatment is reduced to generate $WO_x$ ($2<x<3$) and $WO_2$ with proportion of oxygen lower than that of $WO_3$, leading to a state where $WO_3$ and the oxides with lower proportions of oxygen are mixed. The crystal structure of such a mixed metal oxide depends on the proportion of oxygen; thus, the mechanical strength of the oxide layer is reduced. As a result, the oxide layer is likely to be damaged inside; thus, the separability in a later separation step can be improved.

In addition, a compound containing nitrogen and a material in the separation layer is generated by supplying nitrogen to the oxide layer. Such a compound further reduces the mechanical strength of the oxide layer, so that the separability can be increased. In the case where a metal is included in the separation layer, a compound (a metal nitride) containing the metal and nitrogen is generated in the oxide layer. For example, in the case where tungsten is included in the separation layer, tungsten nitride is generated in the oxide layer.

As the amount of hydrogen supplied to the oxide layer is larger, $WO_3$ is more likely to be reduced, which facilitates the formation of the state where many kinds of oxides with different proportions of oxygen are mixed in the oxide layer. Therefore, the force required for the separation can be reduced. As the amount of nitrogen supplied to the oxide layer is larger, the mechanical strength of the oxide layer can be reduced and the force required for the separation can be reduced. The thickness of the first insulating layer 205 is preferably large for increase in the amount of released hydrogen (and nitrogen). On the other hand, it is preferable that the first insulating layer 205 has a small thickness because the productivity is increased.

The heat treatment may be performed at a temperature higher than or equal to the temperature at which hydrogen (and nitrogen) is released from the first insulating layer 205 and lower than or equal to the temperature at which the formation substrate 231 is softened. The heating is preferably performed at a temperature greater than or equal to the temperature at which the reduction of the metal oxide in the oxide layer with hydrogen occurs. The higher the temperature of the heat treatment is, the more hydrogen (and nitrogen) is released from the first insulating layer 205; thus, the separability can be improved in later steps. Note that depending on heating time and heating temperature, the separability is unnecessarily increased so that separation occurs at an unintended timing. Thus, in the case where tungsten is used for the separation layer 233, the heating temperature is higher than or equal to 300° C. and less than 700° C., preferably higher than or equal to 400° C. and less than 650° C., further preferably higher than or equal to 400° C. and less than or equal to 500° C.

Although the atmosphere in which the heat treatment is performed is not particularly limited and may be an air atmosphere, it is preferably performed in an inert gas atmosphere such as a nitrogen atmosphere or a rare gas atmosphere.

Figure 5C:
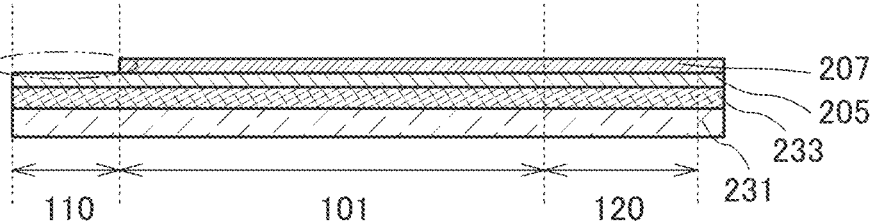

Next, as illustrated in FIG. 5C, the second insulating layer 207 in the region 110 that transmits visible light is removed. The second insulating layer 207 may be removed by a dry etching method, a wet etching method, or the like. Note that any of etching steps included in the fabrication processes of the element layer 209 and the insulating layer 208, or the like may serve as the removal step of the second insulating layer 207.

In one embodiment of the present invention, the second insulating layer 207 is provided over the entire surface of the separation layer 233 until the heat treatment is performed. After the heat treatment, the second insulating layer 207 in the region 110 that transmits visible light is removed. Accordingly, the separability in the region 110 that transmits visible light can be prevented from being lower than that in the other region. Thus, the separability of the entire display panel can be uniform. An influence of the structure of the region 110 that transmits visible light on the yield of the fabrication process of the display panel can be suppressed.

Figure 5D:
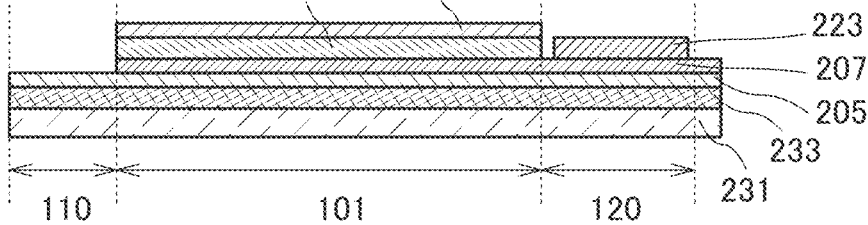
Figure 5E:
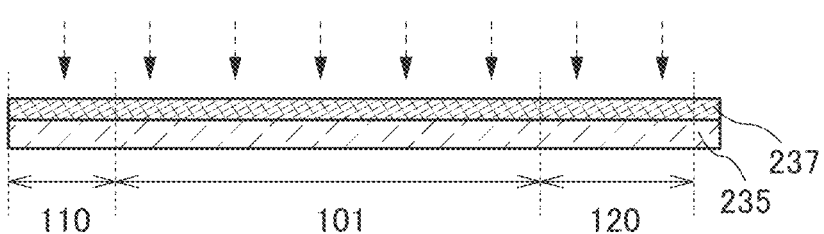

Next, as illustrated in FIG. 5D, the element layer 209, the insulating layer 208, and the connection terminal 223 are formed over the second insulating layer 207. The insulating layer 208 is formed to cover the display element included in the element layer 209. It is preferable that an insulating layer included in the element layer 209 and the insulating layer 208 not be included in the region 110 that transmits visible light.

Next, a substrate 235 bonded to the formation substrate 231 in a later step is prepared. A separation layer 237 is formed over the substrate 235. Then, plasma treatment is performed on a surface of the separation layer 237 (see the arrows indicated by dotted lines in FIG. 5E).

Figure 5F:
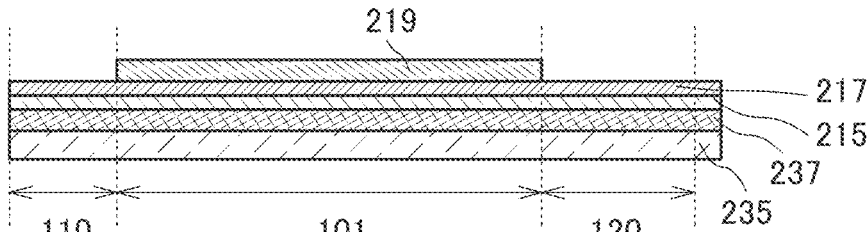

Next, as illustrated in FIG. 5F, a third insulating layer 215 is formed over the separation layer 237, a fourth insulating layer 217 is formed over the third insulating layer 215, and a functional layer 219 is formed over the fourth insulating layer 217.

Note that heat treatment is performed after the fourth insulating layer 217 is formed and before part of the fourth insulating layer 217 is removed. The separation layer 237, the third insulating layer 215, and the fourth insulating layer 217 may be heated before the functional layer 219 is formed. Alternatively, the heat treatment may be performed after at least part of the functional layer 219 is formed. In the case where the process for fabricating the functional layer 219 includes a heating step, the heating step may serve as the heat treatment.

By the heat treatment, the separability in a later separation step can be improved.

Figure 5G:
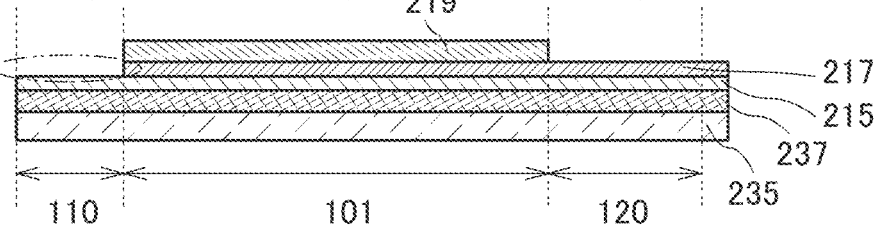

Next, as illustrated in FIG. 5G, the fourth insulating layer 217 in the region 110 that transmits visible light is removed. The fourth insulating layer 217 may be removed by a dry etching method, a wet etching, or the like. Note that any of etching steps included in the fabrication process of the functional layer 219 may serve as the removal step of the fourth insulating layer 217.

In one embodiment of the present invention, the fourth insulating layer 217 is provided over the entire surface of the separation layer 237 until the heat treatment is performed. After the heat treatment, the fourth insulating layer 217 in the region 110 that transmits visible light is removed. Accordingly, the separability of the entire display panel can be uniform. An influence of the structure of the region 110 that transmits visible light on the yield of the fabrication process of the display panel can be suppressed.

Figure 6A:
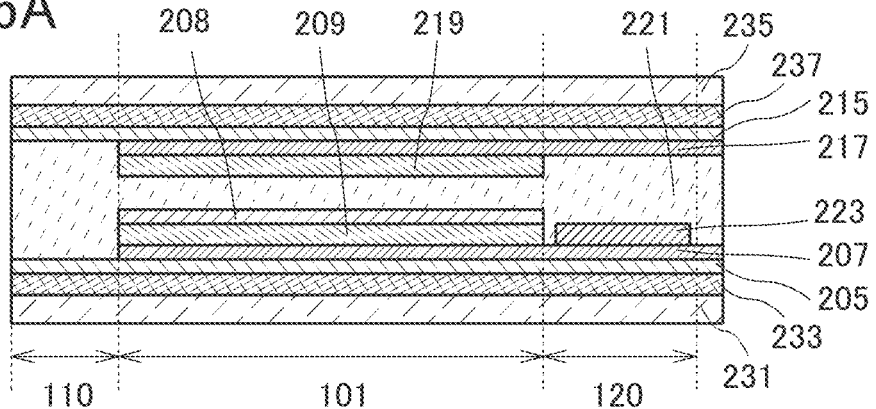
FIGS. 6A to 6C are cross-sectional views illustrating an example of a method for manufacturing the display panel.

Next, the formation substrate 231 and the substrate 235 are attached to each other by the bonding layer 221 (see FIG. 6A).

As the substrate 235, various substrates that can be used as the formation substrate 231 can be used. A flexible substrate may be used. Alternatively, as the substrate 235, a substrate provided with a functional element such as a semiconductor element (e.g., a transistor), a light-emitting element (e.g., an organic EL element), a liquid crystal element, or a sensor element, a color filter, and the like in advance may be used.

As the bonding layer 221, a variety of curable adhesives such as a photocurable adhesive (e.g., an ultraviolet curable adhesive), a reactive curable adhesive, a thermosetting adhesive, and an anaerobic adhesive can be used. Alternatively, as the bonding layer 221, an adhesive with which the substrate 235 and the first insulating layer 205 can be separated when necessary, such as a water-soluble resin, a resin soluble in an organic solvent, a resin that is capable of being plasticized upon irradiation with UV light, or the like may be used.

Then, the separation layer 233 is separated from the first insulating layer 205.

For the separation, for example, the formation substrate 231 or the substrate 235 is fixed to a suction stage and a separation starting point is formed between the separation layer 233 and the first insulating layer 205. The separation starting point may be formed by, for example, inserting a sharp instrument such as a knife between the layers. Alternatively, the separation starting point may be formed by irradiating part of the separation layer 233 with laser light to melt the part of the separation layer 233. The separation starting point may be formed by dripping liquid (e.g., alcohol, water, or water containing carbon dioxide) onto an end portion of the separation layer 233 and the first insulating layer 205 so that the liquid penetrates into an interface between the separation layer 233 and the first insulating layer 205 by using capillary action.

Then, physical force (a separation process with a human hand or with a gripper, a separation process by rotation of a roller, or the like) is gently applied to the area where the separation starting point is formed in a direction substantially perpendicular to the bonded surfaces, so that separation can be caused without damage to the layer to be separated. For example, separation may be caused by attaching tape or the like to the formation substrate 231 or the substrate 235 and pulling the tape in the aforementioned direction, or separation may be caused by pulling an end portion of the formation substrate 231 or the substrate 235 with a hook-like member. Alternatively, separation may be caused by pulling an adhesive member or a member capable of vacuum suction attached to the back side of the formation substrate 231 or the substrate 235.

Here, if separation is performed in such a manner that liquid containing water such as water or an aqueous solution is added to the separation interface and the liquid penetrates into the separation interface, the separability can be improved. Furthermore, an adverse effect of static electricity caused at separation on the functional element included in the layer to be separated (e.g., damage to a semiconductor element from static electricity) can be suppressed.

By the above method, the layer to be separated can be separated from the formation substrate 231 with a high yield.

Figure 6B:
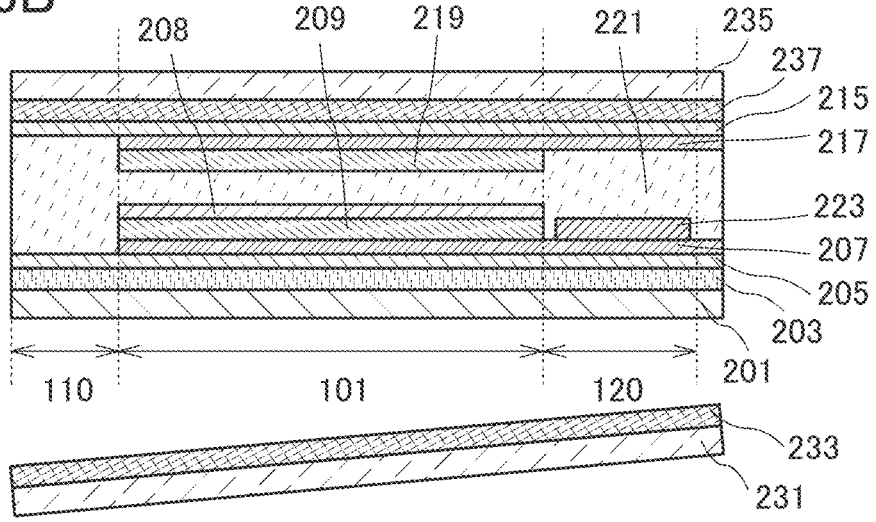
Figure 6C:
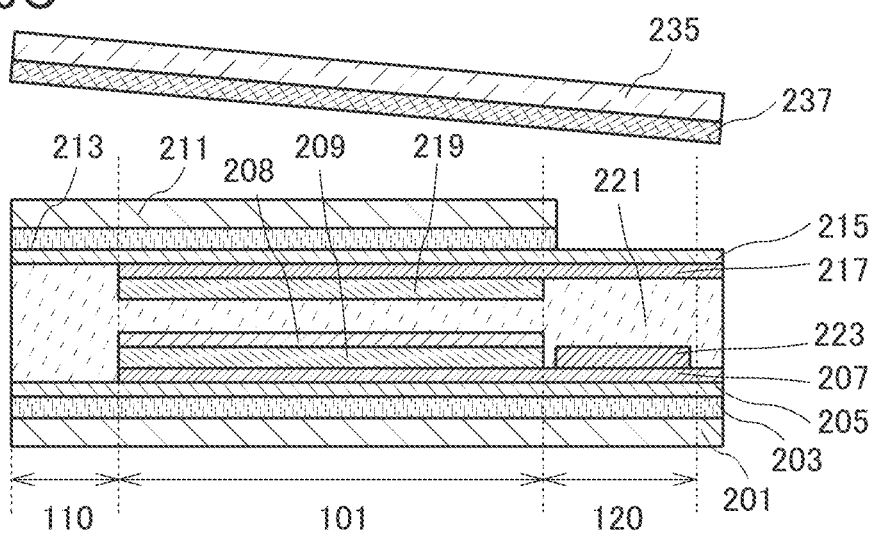

After that, the substrate 201 is attached to the first insulating layer 205 with the bonding layer 203 inserted between (FIG. 6B). The bonding layer 203 can be formed using a material for the bonding layer 221. The substrate 201 can be formed using a material for the substrate 235.

By using flexible substrates as the substrates 201 and 235, a flexible display panel can be fabricated. Note that in the case where the substrate 235 functions as a temporary supporting substrate, the substrate 235 and the separation layer 237 are separated from the layer to be separated, and the separated layer may be attached to a substrate 211 (for example, a flexible substrate) using a bonding layer 213.

As described above, in the method for manufacturing a display panel of one embodiment of the present invention, the heat treatment is performed while the first insulating layer 205 and the second insulating layer 207 are formed over the entire surface of the separation layer 233; thus, the separability of the entire display panel can be uniformly increased. Furthermore, the second insulating layer 207 in the region 110 that transmits visible light is removed after the heat treatment, so that the reflectance in the region 110 that transmits visible light can be reduced.

Moreover, in the method for manufacturing a display panel of one embodiment of the present invention, a functional element is formed over a formation substrate, separated from the formation substrate, and then transferred to another substrate. Thus, there is almost no limitation on the temperature in formation steps of a functional element. Thus, a functional element with extremely high reliability that is manufactured through a high-temperature process can be manufactured over a flexible substrate with poor heat resistance with a high yield. Thus, a highly reliable flexible display panel can be obtained.

In this embodiment, a display panel employing a separate coloring method and having a top-emission structure is described as an example.

FIG. 7C is a cross-sectional view of a display panel 370A employing a separate coloring method and having a top-emission structure. FIG. 7C corresponds to cross-sectional views along dashed-dotted lines A1-A2 and A3-A4 in each of FIGS. 7A and 7B. FIGS. 7A and 7B show top views of the display panel 370A.

The display panel 370A includes the substrate 201, the bonding layer 203, the insulating layer 205, a plurality of transistors, a capacitor 305, a conductive layer 307, an insulating layer 312, an insulating layer 313, an insulating layer 314, an insulating layer 315, a light-emitting element 304, a conductive layer 355, a spacer 316, a bonding layer 317, the substrate 211, the bonding layer 213, and the insulating layer 215.

The layers included in the region 110 transmitting visible light transmit visible light. FIG. 14C illustrates an example where the region 110 transmitting visible light includes the substrate 201, the bonding layer 203, the insulating layer 205, a gate insulating layer 311, the insulating layer 312, the insulating layer 313, the insulating layer 314, the bonding layer 317, the insulating layer 215, the bonding layer 213, and the substrate 211. In this stacked-layer structure, the materials for the layers are preferably selected such that a difference in refractive index at each interface is minimized.

The driver circuit portion 382 includes a transistor 301. The display portion 381 includes a transistor 302 and a transistor 303.

Each transistor includes a gate, the gate insulating layer 311, a semiconductor layer, a source, and a drain. The gate and the semiconductor layer overlap with each other with the gate insulating layer 311 provided therebetween. Part of the gate insulating layer 311 functions as a dielectric of the capacitor 305. The conductive layer functioning as the source or the drain of the transistor 302 serves as one electrode of the capacitor 305.

FIG. 7C shows a bottom gate transistor. The structure of the transistor may be different between the driver circuit portion 382 and the display portion 381. The driver circuit portion 382 and the display portion 381 may each include a plurality of kinds of transistors.

The capacitor 305 includes a pair of electrodes and the dielectric therebetween. The capacitor 305 includes a conductive layer that is formed using the same material and the same step as the gate (the lower gate) of the transistor and a conductive layer that is formed using the same material and the same step as the source and the drain of the transistor.

A material through which impurities such as water and hydrogen do not easily diffuse is preferably used for at least one of the insulating layers 312, 313, and 314. Diffusion of impurities from the outside into the transistors can be effectively inhibited, leading to improved reliability of the display panel. The insulating layer 314 functions as a planarization layer. In the example illustrated in FIG. 7C, the insulating layer 314 is formed using an organic material and extends over the entire area of the display panel. Such a structure is preferable because the yield of the peeling process can be increased. Alternatively, a structure can be employed in which the insulating layer formed using an organic material is not placed in an end portion of the display panel. This structure can inhibit entry of impurities into the light-emitting element 304.

The insulating layer 205 and the substrate 201 are attached to each other with the bonding layer 203. The insulating layer 215 and the substrate 211 are attached to each other with the bonding layer 213.

In the display portion 381, the light-emitting element 304 is positioned between the insulating layer 205 and the insulating layer 215. Entry of impurities into the light-emitting element 304 from the thickness direction of the display panel 370A is suppressed. Similarly, a plurality of insulating layers covering the transistors are provided in the display portion 381, and thus entry of impurities into the transistors is suppressed.

The light-emitting element 304, the transistors, and the like are preferably provided between a pair of insulating films that are highly resistant to moisture, in which case entry of impurities such as water into these elements can be suppressed, leading to higher reliability of the display panel.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m²·day)], preferably lower than or equal to $1\times10^{-6}$ [g/(m²·day)], further preferably lower than or equal to $1\times10^{-7}$ [g/(m²·day)], still further preferably lower than or equal to $1\times10^{-8}$ [g/(m²·day)].

In the case where the insulating layer 314 is formed using an organic material, impurities such as moisture might enter the light-emitting element 304 and the like from the outside of the display panel through the insulating layer 314 exposed at an end portion of the display panel. Deterioration of the light-emitting element 304 due to the entry of an impurity leads to deterioration of the display panel. Thus, as illustrated in a portion near a connection portion 306 in FIG. 7C, it is preferable that an opening that reaches an inorganic film (here, the insulating layer 313) be formed in the insulating layer 314 so that an impurity such as moisture entering from the outside of the display panel does not easily reach the light-emitting element 304.

The light-emitting element 304 includes an electrode 321, an EL layer 322, and an electrode 323. The light-emitting element 304 may include an optical adjustment layer 324. The light-emitting element 304 emits light to the substrate 211 side.

The transistor, the capacitor, the wiring, and the like are provided to overlap with a light-emitting region of the light-emitting element 304, whereby an aperture ratio of the display portion 381 can be increased.

One of the electrode 321 and the electrode 323 functions as an anode and the other functions as a cathode. When a voltage higher than the threshold voltage of the light-emitting element 304 is applied between the electrode 321 and the electrode 323, holes are injected to the EL layer 322 from the anode side and electrons are injected to the EL layer 322 from the cathode side. The injected electrons and holes are recombined in the EL layer 322 and a light-emitting substance contained in the EL layer 322 emits light.

The electrode 321 is electrically connected to the source or the drain of the transistor 303, directly or through another conductive layer. The electrode 321 functions as a pixel electrode and is provided for each light-emitting element 304. Two adjacent electrodes 321 are electrically insulated from each other by the insulating layer 315.

The EL layer 322 is a layer containing a light-emitting material. As the light-emitting element 304, an organic EL element including an organic compound as a light-emitting material can be favorably used.

The EL layer 322 includes at least one light-emitting layer.

As a light-emitting material, a quantum dot can be used. A quantum dot is a semiconductor nanocrystal with a size of several nanometers and contains approximately $1\times10^{3}$ to $1\times10^{6}$ atoms. Since energy shift of quantum dots depends on their size, quantum dots made of the same substance emit light with different wavelengths depending on their size; thus, emission wavelengths can be easily adjusted by changing the size of quantum dots.

A quantum dot has an emission spectrum with a narrow peak, leading to emission with high color purity. In addition, a quantum dot is said to have a theoretical internal quantum efficiency of approximately 100%, and a quantum dot can be used as a light-emitting material to obtain a light-emitting element having high light emission efficiency. Furthermore, since a quantum dot that is an inorganic compound has high inherent stability, a light-emitting element that is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

As examples of a material included in a quantum dot, cadmium selenide, cadmium sulfide, cadmium telluride, zinc sulfide, indium phosphide, lead selenide, lead sulfide, a compound of selenium, zinc, and cadmium, a compound of cadmium, selenium, and sulfur, and the like can be given. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. It is preferable to use a core-shell or core-multishell quantum dot because the quantum efficiency of light emission can be significantly improved. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. In this manner, cohesion of quantum dots can be prevented and solubility in a solvent can be increased. It can also reduce reactivity and improve electrical stability.

The range of size (diameter) of quantum dots is usually greater than or equal to 0.5 nm and less than or equal to 20 nm, preferably greater than or equal to 1 nm and less than or equal to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like.

Even when a light-emitting layer is composed of quantum dots and made without a host material, the quantum dots enable light emission efficiency to be ensured; thus, a light-emitting element that is favorable in terms of a lifetime can be obtained. In the case where the light-emitting layer is composed of quantum dots, the quantum dots preferably have core-shell structures (including core-multishell structures).

The electrode 323 functions as a common electrode and is provided for a plurality of light-emitting elements 304. A fixed potential is supplied to the electrode 323.

Note that one embodiment of the present invention is not limited to the separate coloring method, and a color filter method, a color conversion method, a quantum dot method, and the like may be employed.

The light-emitting element 304 overlaps with the coloring layer 325 with the bonding layer 317 provided therebetween. The spacer 316 overlaps with the light-blocking layer 326 with the bonding layer 317 provided therebetween. Although FIG. 7C illustrates the case where a space is provided between the light-emitting element 304 and the light-blocking layer 326, the light-emitting element 304 and the light-blocking layer 326 may be in contact with each other. Although the spacer 316 is provided on the substrate 201 side in the structure illustrated in FIG. 7C, the spacer 316 may be provided on the substrate 211 side (e.g., in a position closer to the substrate 201 than that of the light-blocking layer 326).

The coloring layer is a colored layer that transmits light in a specific wavelength range. For example, a color filter that transmits light in a specific wavelength range, such as red, green, blue, or yellow light, can be used. Examples of materials that can be used for the coloring layer include a metal material, a resin material, and a resin material containing a pigment or dye.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using a metal material or a resin material containing pigment or dye. Note that it is preferable to provide the light-blocking layer in a region other than a pixel portion, such as a driver circuit, in which case undesired leakage of guided light or the like can be suppressed.

The connection portion 306 includes the conductive layer 307 and the conductive layer 355. The conductive layer 307 and the conductive layer 355 are electrically connected to each other. The conductive layer 307 can be formed using the same material and the same step as those of the source and the drain of the transistor. The conductive layer 355 is electrically connected to an external input terminal through which a signal or a potential from the outside is transmitted to the driver circuit portion 382. Here, an example in which an FPC 373 is provided as an external input terminal is shown. The FPC 373 and the conductive layer 355 are electrically connected to each other through a connector 319.

As the connector 319, any of various anisotropic conductive films (ACF), anisotropic conductive pastes (ACP), and the like can be used.

Figure 9:
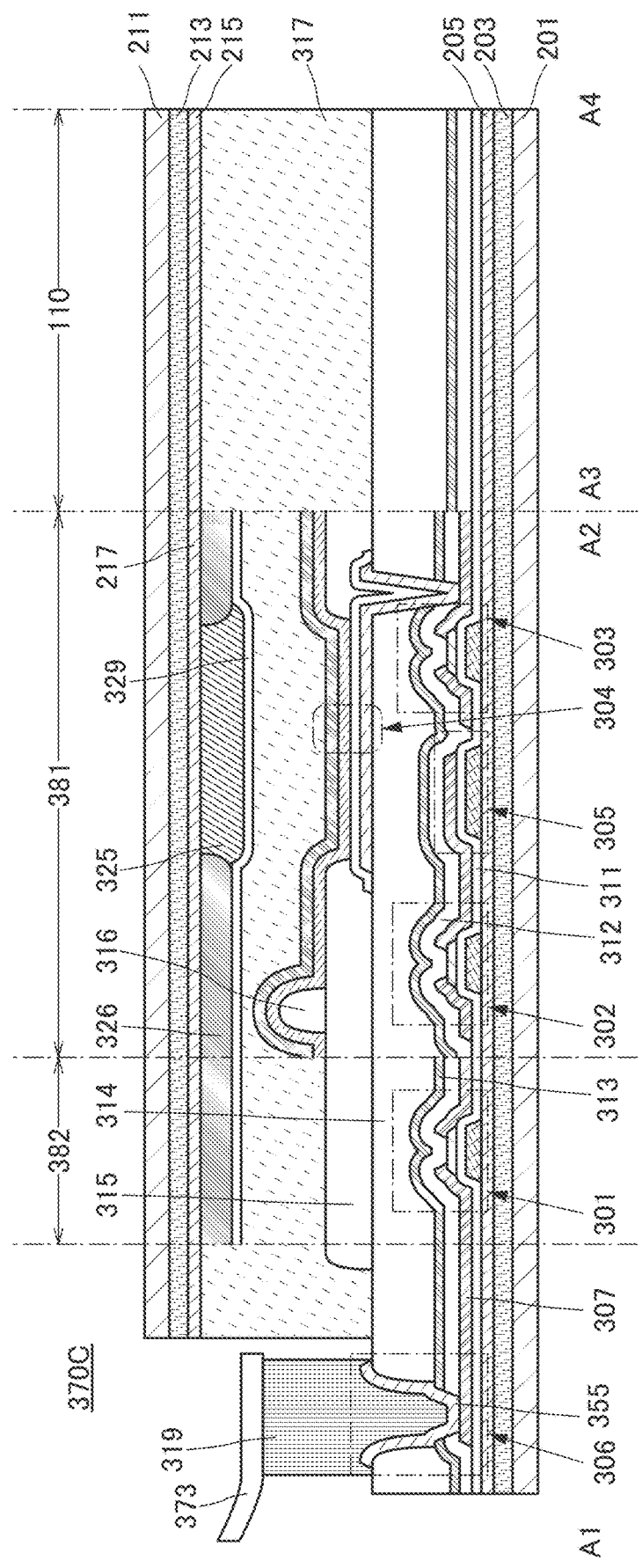
FIG. 9 is a cross-sectional view illustrating an example of a display panel.

The transistors 301, 302, and 303 each include a gate, the gate insulating layer 311, a semiconductor layer, a source, and a drain. FIG. 9 illustrates a bottom gate transistor.

A display panel may include an overcoat. The overcoat can prevent impurities and the like contained in the coloring layer 325 from being diffused into the light-emitting element 304. The overcoat is formed using a material that transmits light emitted from the light-emitting element 304. For example, it is possible to use an inorganic insulating film such as a silicon nitride film or a silicon oxide film, an organic insulating film such as an acrylic film or a polyimide film, or a stacked layer of an organic insulating film and an inorganic insulating film.

A flexible substrate is preferably used as each of the substrates 201 and 211. For example, a material such as glass, quartz, a resin, a metal, an alloy, or a semiconductor thin enough to have flexibility can be used. The substrate through which light is extracted from the light-emitting element is formed using a material that transmits the light. For example, the thickness of the flexible substrate is preferably greater than or equal to 1 μm and less than or equal to 200 µm, further preferably greater than or equal to 1 µm and less than or equal to 100 µm, still further preferably greater than or equal to 10 µm and less than or equal to 50 µm, and particularly preferably greater than or equal to 10 µm and less than or equal to 25 µm. The thickness and hardness of the flexible substrate are set in the range where mechanical strength and flexibility can be balanced against each other. The flexible substrate may have a single-layer structure or a stacked-layer structure.

A resin, that has a specific gravity smaller than that of glass, is preferably used for the flexible substrate, in which case the display panel can be lightweight as compared with the case where glass is used.

The substrate is preferably formed using a material with high toughness. In that case, a display panel with high impact resistance that is less likely to be broken can be provided. For example, when a resin substrate or a thin metal or alloy substrate is used, the display panel can be lightweight and unlikely to be broken as compared with the case where a glass substrate is used.

A metal material and an alloy material, which have high thermal conductivity, are preferable because they can easily conduct heat to the whole substrate and accordingly can suppress a local temperature rise in the display panel. The thickness of a substrate using a metal material or an alloy material is preferably greater than or equal to 10 µm and less than or equal to 200 µm, further preferably greater than or equal to 20 µm and less than or equal to 50 µm.

There is no particular limitation on a material of the metal substrate or the alloy substrate, but it is preferable to use, for example, aluminum, copper, nickel, or a metal alloy such as an aluminum alloy or stainless steel. Examples of a material for a semiconductor substrate include silicon and the like.

Furthermore, when a material with high thermal emissivity is used for the substrate, increase of the surface temperature of the display panel can be suppressed, and breakage or a decrease in reliability of the display panel can be suppressed. For example, the substrate may have a stacked-layer structure of a metal substrate and a layer with high thermal emissivity (the layer can be formed using a metal oxide or a ceramic material, for example).

Examples of materials having flexibility and a light-transmitting property include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin. In particular, a material with a low coefficient of linear expansion is preferred, and for example, a polyamide imide resin, a polyimide resin, a polyamide resin, or PET can be suitably used. A substrate in which a fibrous body is impregnated with a resin, a substrate whose linear thermal expansion coefficient is reduced by mixing an inorganic filler with a resin, or the like can also be used.

The flexible substrate may have a stacked-layer structure in which at least one of a hard coat layer (e.g., a silicon nitride layer) by which a surface of the device is protected from damage, a layer for dispersing pressure (e.g., an aramid resin layer), and the like is stacked over a layer of any of the above-mentioned materials. A substrate that can be used as the protective substrate 132 may be used.

When a glass layer is used for the flexible substrate, a barrier property against water and oxygen can be improved and thus a highly reliable display panel can be provided.

For the bonding layer, various curable adhesives such as a photocurable adhesive (e.g., an ultraviolet curable adhesive), a reactive curable adhesive, a thermosetting adhesive, and an anaerobic adhesive can be used. Alternatively, an adhesive sheet or the like may be used.

Furthermore, the bonding layer may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because entry of impurities such as moisture into the functional element can be suppressed, thereby improving the reliability of the display panel.

When a filler with a high refractive index or a light scattering member is contained in the bonding layer, the efficiency of light extraction from the light-emitting element can be improved. For example, titanium oxide, barium oxide, zeolite, or zirconium can be used.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used. Any of a variety of display elements can be used in the display panel of one embodiment of the present invention. For example, a liquid crystal element, an electrophoretic element, a display element using MEMS, or the like may be used.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

The conductive film that transmits visible light can be formed using, for example, indium oxide, ITO, indium zinc oxide, zinc oxide (ZnO), or ZnO to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used. An alloy containing silver and copper is preferable because of its high heat resistance. Furthermore, when a metal film or a metal oxide film is stacked on and in contact with an aluminum alloy film, oxidation of the aluminum alloy film can be suppressed. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

The EL layer 322 includes at least one light-emitting layer. The EL layer 322 may include a plurality of light-emitting layers. In addition to the light-emitting layer, the EL layer 322 can further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 322, either a low molecular compound or a high molecular compound can be used, and an inorganic compound may also be used. Each of the layers included in the EL layer 322 can be formed by any of the following methods: an evaporation method (including a vacuum evaporation method), a transfer method, a printing method, an inkjet method, a coating method, and the like.

The light-emitting element 304 may contain two or more kinds of light-emitting substances. Thus, for example, a light-emitting element that emits white light can be achieved. For example, light-emitting substances are selected so that two or more kinds of light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example.

Moreover, the light-emitting element 304 may be a single element including one EL layer or a tandem element in which EL layers are stacked with a charge generation layer provided therebetween.

The structure of the transistors in the display panel is not particularly limited. For example, a planar transistor, a forward staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

A semiconductor material used for the semiconductor layer of the transistor is not particularly limited, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). Further preferably, the oxide semiconductor contains an oxide represented by an In-M-Zn oxide (M is a metal such as Al, Ti, Ga, Ge, Y, Zr, Sn, La, Ce, Hf, or Nd).

A c-axis aligned crystalline oxide semiconductor (CAAC-OS) is preferably used as a semiconductor material for the transistors. Unlike an amorphous semiconductor, the CAAC-OS has few defect states, so that the reliability of the transistor can be improved. Moreover, since no grain boundary is observed in the CAAC-OS, a stable and uniform film can be formed over a large area, and stress that is caused by bending a flexible display device does not easily make a crack in a CAAC-OS film.

The CAAC-OS is a crystalline oxide semiconductor in which c-axes of crystals are oriented in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

The CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

An organic insulating material or an inorganic insulating material can be used for the insulating layers included in the display panel. Examples of resins include an acrylic resin, an epoxy resin, a polyimide resin, a polyamide resin, a polyimide-amide resin, a siloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The conductive layers included in the display panel can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, ITO, indium oxide containing tungsten, indium zinc oxide containing tungsten, indium oxide containing titanium, ITO containing titanium, indium zinc oxide, ZnO, ZnO to which gallium is added, or indium tin oxide containing silicon may be used. Alternatively, a semiconductor such as an oxide semiconductor or polycrystalline silicon whose resistance is lowered by containing an impurity element or the like, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Figure 8:
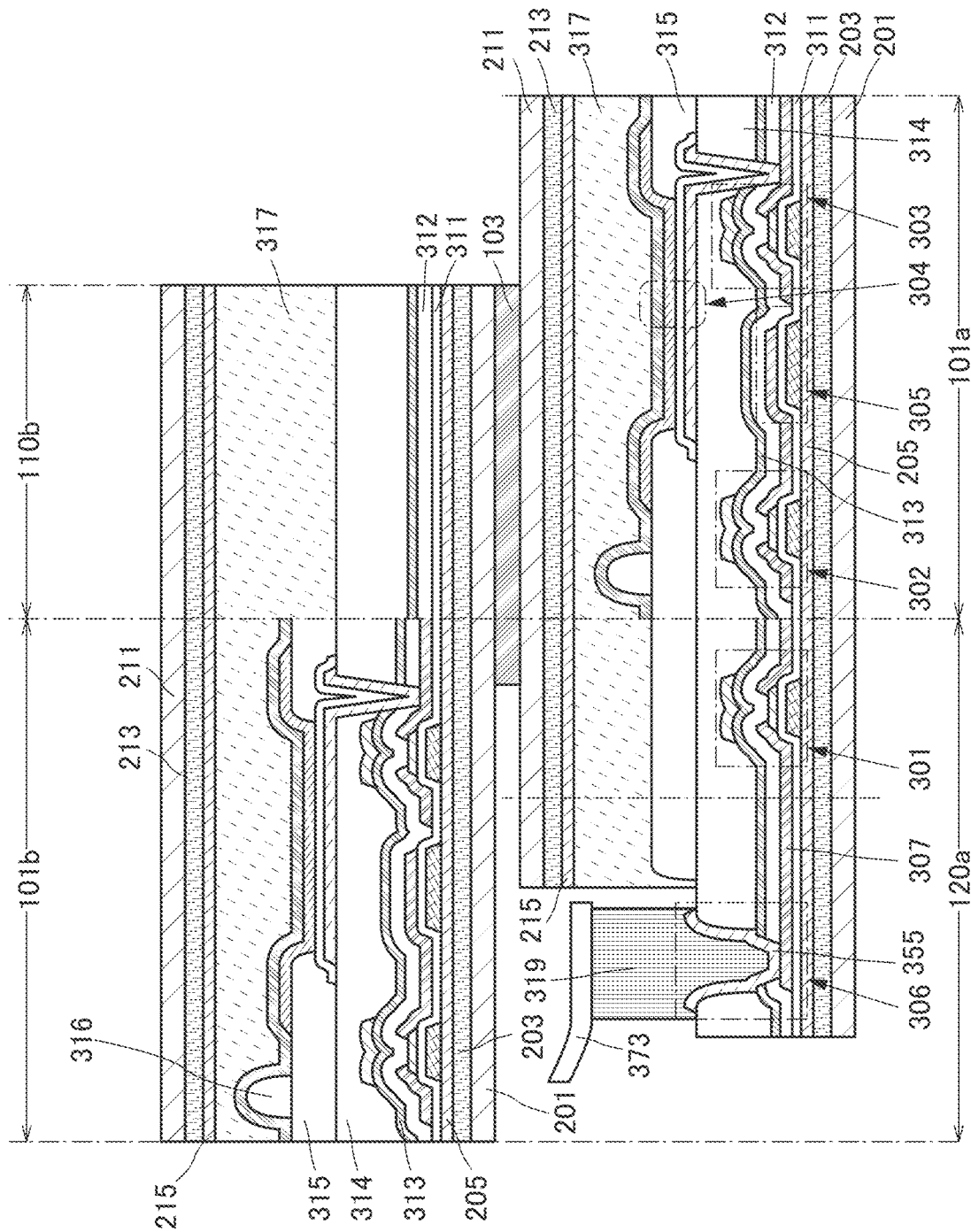
FIG. 8 is a cross-sectional view illustrating an example of a display device.

FIG. 8 is an example of a cross-sectional view of a display device including two display panels 370A illustrated in FIG. 7C that overlap with each other.

FIG. 8 illustrates the display region 101a (corresponding to the display portion 381 in FIG. 7C) and the region 120a that blocks visible light (corresponding to the driver circuit portion 382 and the like in FIG. 7C) of a lower display panel, and the display region 101b (corresponding to the display portion 381 in FIG. 7C) and the region 110b that transmits visible light (corresponding to the region 110 that transmits visible light in FIG. 7C) of an upper display panel.

In the display device illustrated in FIG. 8, the display panel positioned on the display surface side (upper side) includes the region 110b that transmits visible light adjacent to the display region 101b. The display region 101a of the lower display panel and the region 110b that transmits visible light of the upper display panel overlap with each other. Thus, a non-display region that appears between the display regions of the two display panels overlapping with each other can be reduced or even removed. Accordingly, a large display device in which a seam between display panels is less likely to be noticed by a user can be obtained.

The display device illustrated in FIG. 8 includes the light-transmitting layer 103 having a refractive index higher than that of air and transmitting visible light between the display region 101a and the region 110b that transmits visible light. In that case, air can be prevented from entering between the display region 101a and the region 110b that transmits visible light, so that the interface reflection due to a difference in refractive index can be reduced. In addition, display unevenness or luminance unevenness of the display device can be suppressed.

The light-transmitting layer 103 may overlap with the entire surface of the substrate 211 of the lower display panel or that of the substrate 201 of the upper display panel, or may overlap with only the display region 101a and the region 110b that transmits visible light. In addition, the light-transmitting layer 103 may overlap with the region 120a that blocks visible light.

For example, an attachment film in which attachment layers are provided on both surfaces of a base material can be used as the light-transmitting layer 103.

The reflection of light in the region 110b that transmits visible light is suppressed. Thus, an area in which the two display panels overlap with each other (an overlapping area) is less likely to be seen by a user of the display device. Moreover, in the display in the display region 101a, a difference in luminance between a portion seen through the region 110b that transmits visible light and a portion seen not through the region can be small.

<Example of Cross-Sectional Structure of Display Panel>

FIG. 9 is a cross-sectional view of a display panel 370C employing a color filter method and having a top-emission structure.

The display panel 370C is different from the display panel 370A in that the EL layer is shared by a plurality of light-emitting elements, each transistor does not include a back gate, and a coloring layer 325 and a light-blocking layer 326 are provided.

In the display panel 370D, the light-emitting element 304 emits light to the coloring layer 325 side.

Owing to the combination of a color filter (the coloring layer 325) and a microcavity structure (the optical adjustment layer 324), light with high color purity can be extracted from the display panel. The thickness of the optical adjustment layer 324 is varied depending on the color of the pixel.

The coloring layer is a colored layer that transmits light in a specific wavelength range. For example, a color filter that transmits light in a specific wavelength range, such as red, green, blue, or yellow light, can be used. Examples of materials that can be used for the coloring layer include a metal material, a resin material, and a resin material containing a pigment or dye.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using a metal material or a resin material containing a pigment or dye. Note that it is preferable to provide the light-blocking layer in a region other than a pixel portion, such as a driver circuit, in which case undesired leakage of guided light or the like can be suppressed.

A display panel may include an overcoat. The overcoat can prevent impurities and the like contained in the coloring layer 325 from being diffused into the light-emitting element 304. The overcoat is formed using a material that transmits light emitted from the light-emitting element 304. For example, it is possible to use an inorganic insulating film such as a silicon nitride film or a silicon oxide film, an organic insulating film such as an acrylic film or a polyimide film, or a stacked layer of an organic insulating film and an inorganic insulating film.

This embodiment can be freely combined with Embodiment 1.

Example 1

<Display Panel>

First, the display panel used in the display device in this example is described.

Figure 10A:
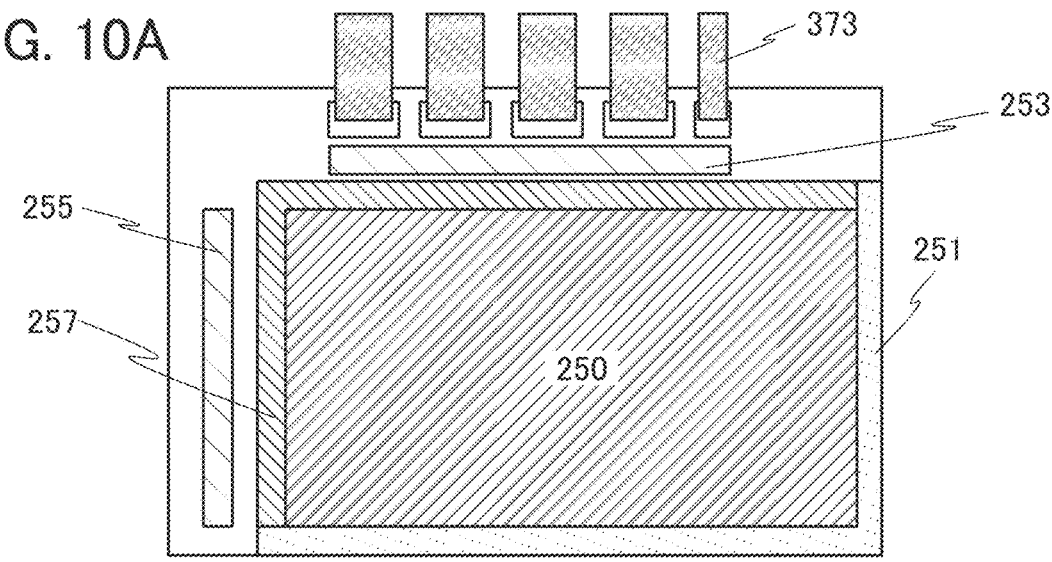
FIGS. 10A to 10C illustrate a display panel and a display device of Example 1.

FIG. 10A is a schematic view of the display panel in this example. The display panel illustrated in FIG. 10A was an active matrix organic EL display that had the light-emitting portion 250 with a size of 13.5 inches diagonally, 1280×720 effective pixels, a resolution of 108 ppi, and an aperture ratio of 41.3%. The display panel includes a demultiplexer (De-MUX) 253 serving as a source driver. In addition, the display panel also included the scan driver 255. Two sides of the light-emitting portion 250 are in contact with a region 251 transmitting visible light. A lead wiring 257 is provided along the other two sides.

A channel-etched transistor including a CAAC-OS was used as a transistor. Note that an In—Ga—Zn-based oxide was used for the oxide semiconductor.

As the light-emitting element, an organic EL element employing a separate coloring method and having a top-emission structure was used. The light-emitting element has a top emission structure combined with a color filter, where light generated by the light-emitting element is extracted to the outside of the display panel through the color filter.

Figure 10B:
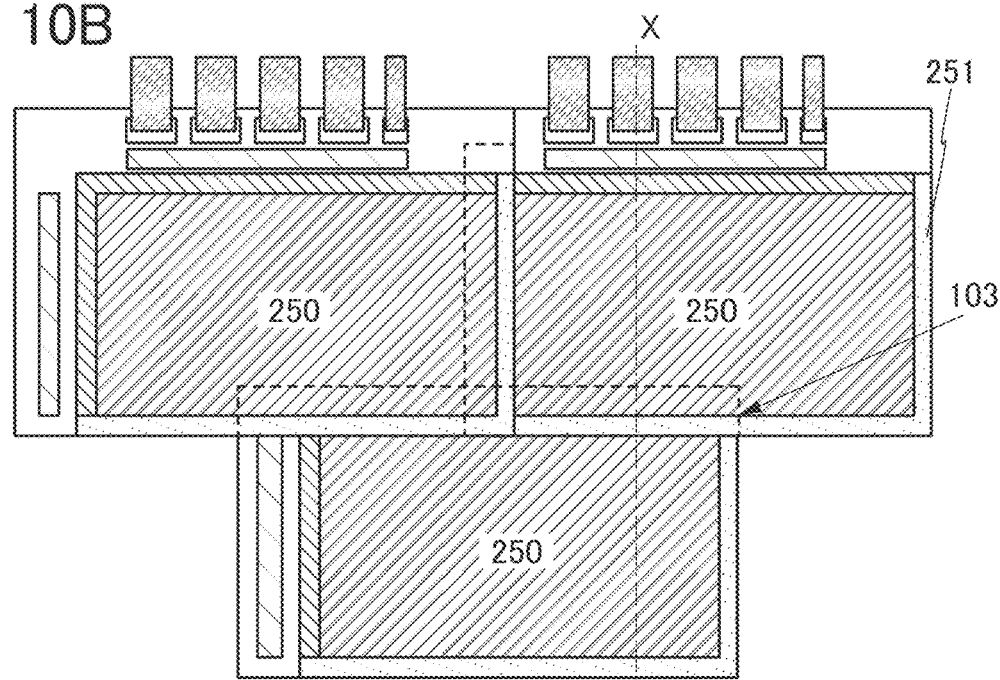
Figure 10C:
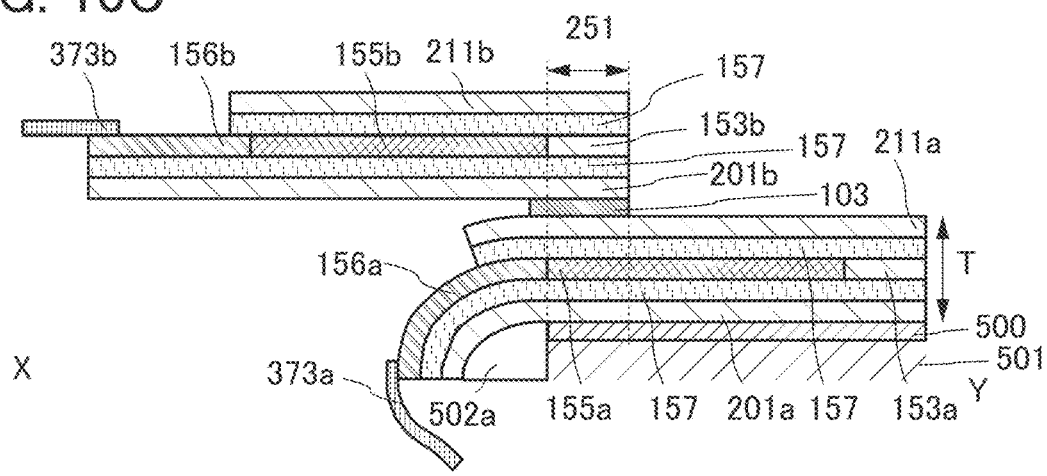

FIG. 10B is a schematic view of a display device in which three display panels overlap with each other to have a T shape. FIG. 10C shows a cross-sectional schematic view taken along a dashed dotted line X-Y of the display device of FIG. 10B.

The display device in this example was formed by overlapping a plurality of display panels so that a non-display region between display regions was small. Specifically, the light-transmitting layer 103 was provided between the region 251 transmitting visible light of an upper display panel and the light-emitting portion 250 of a lower display panel.

A component that blocks visible light such as a lead wiring or a driver is not provided at all from an end portion of the light-emitting portion 250 to an end portion of the display panel along two sides of the display panel, and the region along two sides serves as the region 251 transmitting visible light. The width of the region 251 transmitting visible light of the display panel was approximately 5 mm. The thickness T of the region 251 that transmits visible light (also referred to as a thickness of one display panel) is very small, which is approximately 110 μm. Therefore, although the display device in this example had a region in which at most three display panels overlapped with each other, a step formed on the display surface side was extremely small; thus, a seam hardly stood out.

Each of the three display panels has flexibility. For example, as illustrate in FIG. 10C, a region near an FPC 373a of the lower display panel can be bent so that part of the lower display panel and part of the FPC 373a can be placed under the light-emitting portion 250 of the upper display panel adjacent to the FPC 373a. As a result, the FPC 373a can be placed without physical interference with the rear surface of the upper display panel. In this way, another display panel can be provided on any one or more of the four sides of the display panel, whereby a large-sized display device is easily realized.

In this example, an attachment film including attachment layers on both surfaces of a base material was used as the light-transmitting layer 103. With use of the attachment film, two display panels included in the display device can be detachably attached to each other. An attachment layer on one side of the light-transmitting layer 103 was attached to a substrate 211a, and an attachment layer on the other side of the light-transmitting layer 103 was attached to a substrate 201b.

In FIG. 10B, the light-transmitting layer 103 includes not only a portion overlapping with the region 251 that transmits visible light, but also a portion overlapping with the light-emitting portion 250. In FIG. 10C, the light-transmitting layer 103 overlaps with the entire region 251 that transmits visible light from an end portion of the substrate 201b, and also overlaps with part of a region 155b containing a display element. Note that the light-transmitting layer 103 is not provided on a curved region of the display panel that is close to a region to which the FPC 373a is connected illustrated in FIG. 10C. However, the light-transmitting layer 103 may be provided on a curved portion of the display panel depending on the thickness or flexibility of the light-transmitting layer 103.

Each of the display panels was formed by attaching a substrate and an element layer with a bonding layer. For example, as illustrated in FIG. 10C, a substrate 201a, the substrate 211a, the substrate 201b, and a substrate 211b are attached to an element layer 153a, the element layer 153a, an element layer 153b, and the element layer 153b respectively, with a bonding layer 157. The element layer 153a has a region 155a including a display element and a region 156a including a wiring electrically connected to the display element. Similarly, the element layer 153b has the region 155b including a display element and a region 156b including a wiring electrically connected to the display element.

As illustrated in FIG. 10C, one of the three display panels is fixed to the member 501 having a curved surface with the buffer plate 500 provided therebetween.

Figure 15A:
FIGS. 15A and 15B are photographs of a display device of Example 1.
Figure 15B:
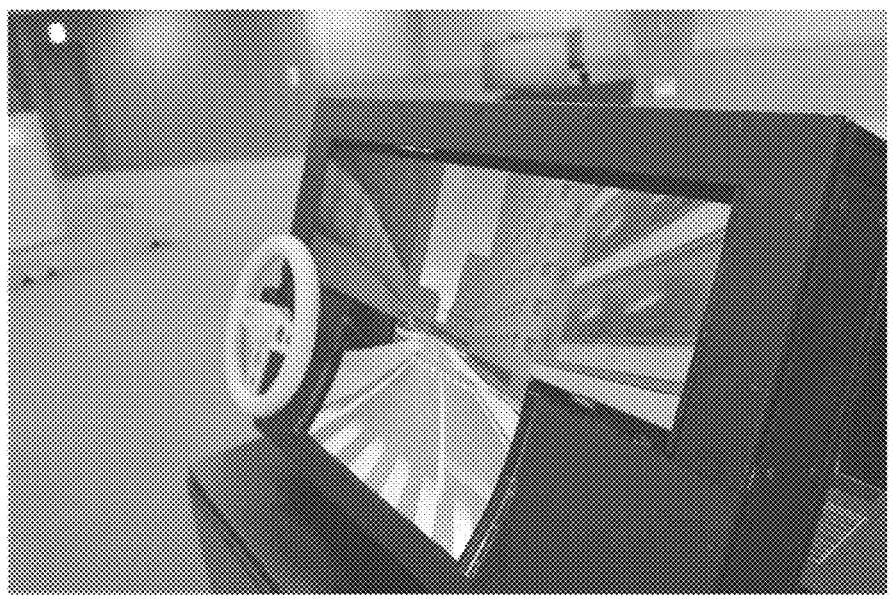

In this example, a member, a guide portion, and the like that serve as part of a display device are designed, and flexible display panels are fixed to the member having a curved surface with a buffer plate provided therebetween. The curved surface of the member has a radius of curvature of 780 mm. As the buffer plate, a 0.5-mm-thick aluminum plate is used. In this example, one of the three display panels illustrated in FIG. 10B that overlaps with the other two display panels on one side is fixed to a member having a curved surface with a buffer plate provided therebetween. FIG. 15A is a photograph showing an image displayed on the display panels. FIG. 15B is a photograph from an oblique angle. Note that a car navigation image is displayed on the display device shown in FIGS. 15A and 15B.

Figure 11:
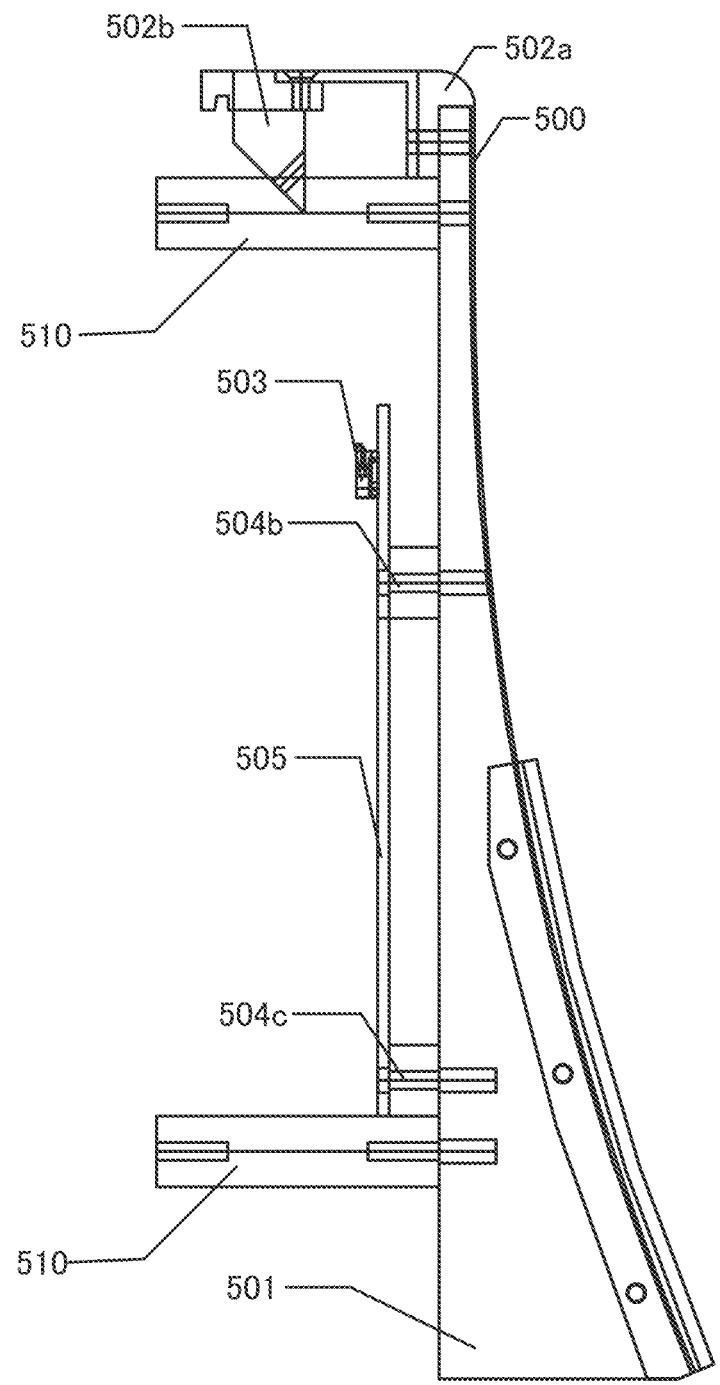
FIG. 11 is a design for a member of Example 1.
Figures 12A, 12B:
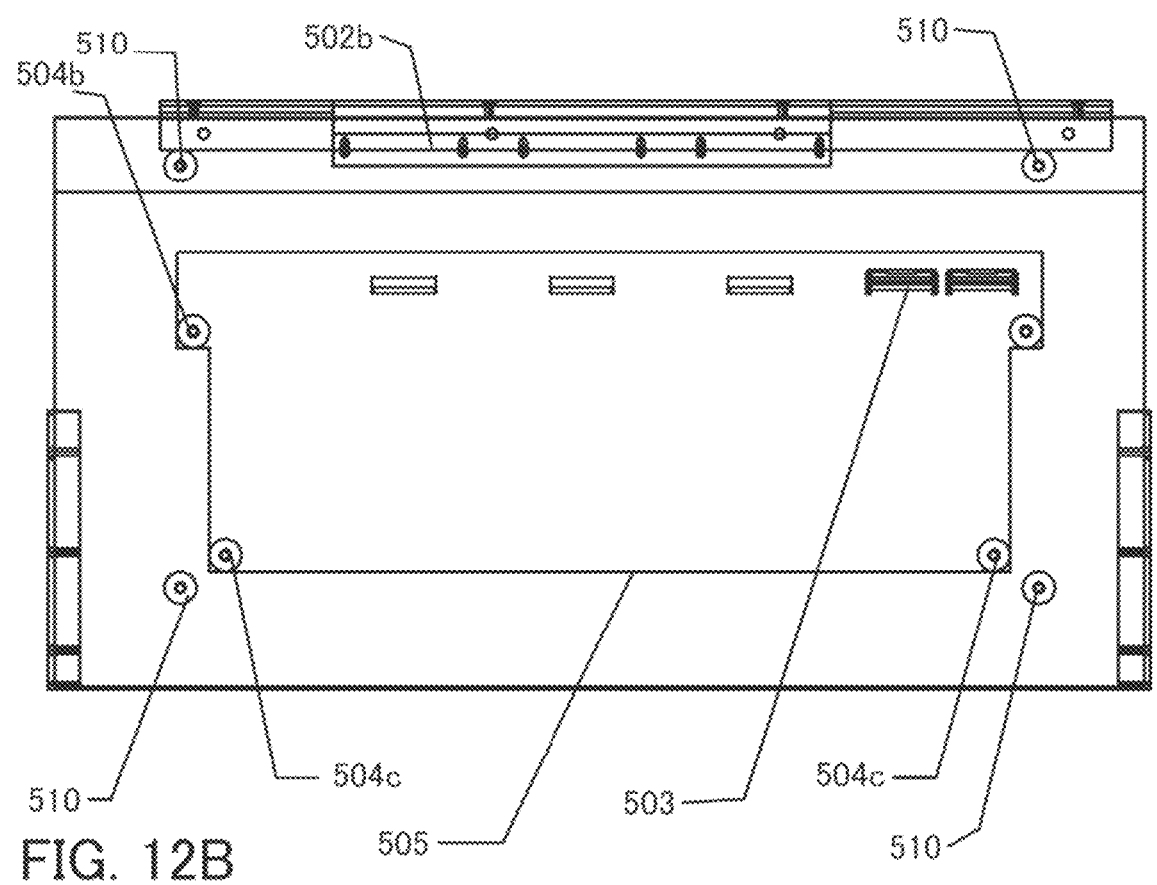
FIGS. 12A and 12B are a design and a photograph of the member of Example 1.

FIG. 11 is a side view of a design including a member which overlaps with a display panel, a guide portion, and the like. FIG. 12A is a rear view seen from the printed circuit board side.

In FIG. 11 and FIG. 12A, four leg portions 510 are provided so that the display panel faces upward. In FIG. 11 and FIG. 12A, explanation will be made using the same reference numerals for the portions that are common to those in FIG. 1. Note that a display panel and an FPC are not illustrated in FIG. 11 and FIG. 12A.

Figure 13:
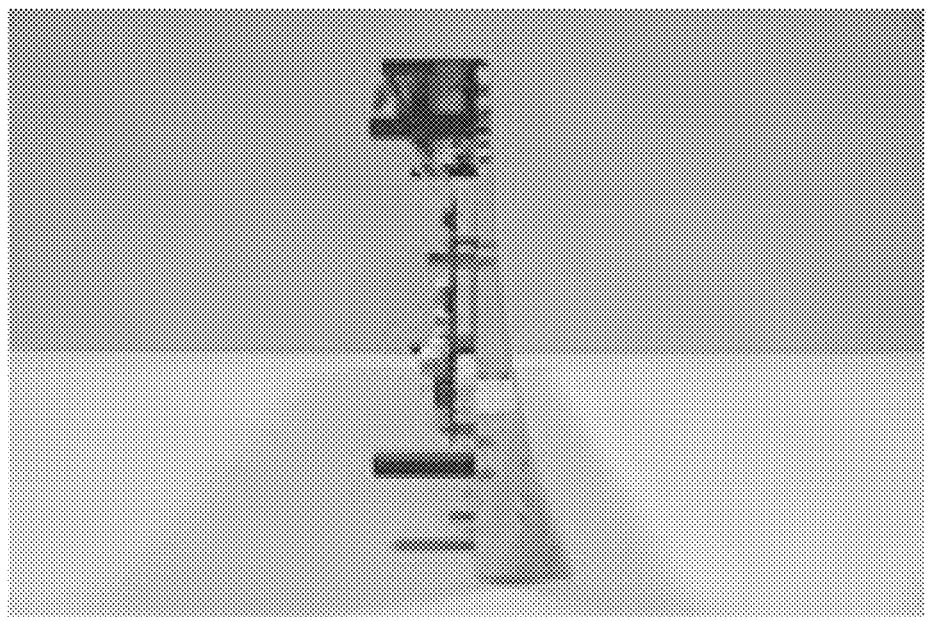
FIG. 13 is a photograph taken from a side of a display panel of Example 1.

FIG. 12B is a photograph taken from the printed circuit board side in which the display panel and the FPC are connected to each other. FIG. 13 is a photograph taken from the side in which the display panel and the FPC are connected to each other.

Figure 14A:
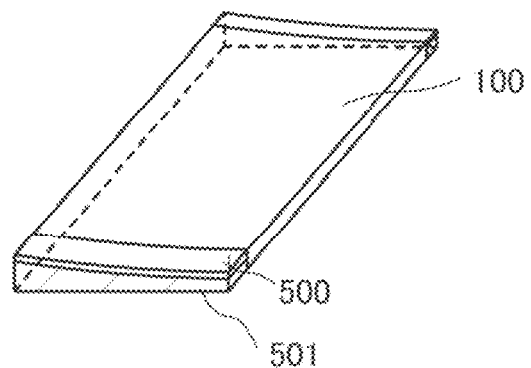
FIGS. 14A to 14C are a perspective view of a sample structure for experiment and photographs of the experiment results.
Figure 14B:
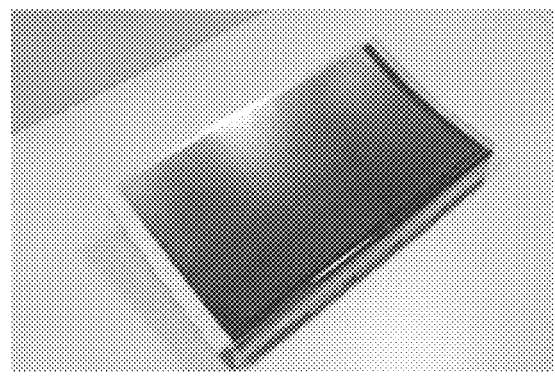
Figure 14C:
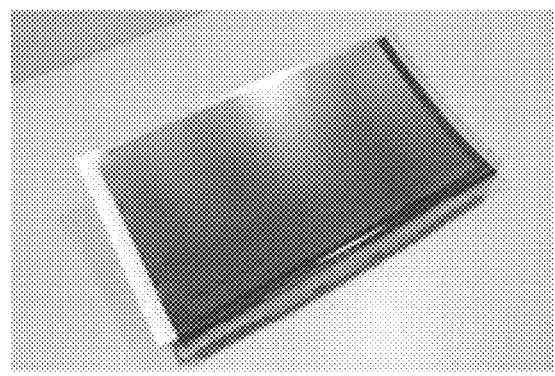

FIG. 14A is a perspective view of the display panel whose display surface faces upward. FIG. 14B is a photograph taken from the above of the display panel in which four leg portions 510 are contact with the top surface of a desk.

FIG. 14C shows the results of a thermal shock preservation test. FIG. 14C is a photograph after preservation at 40° C. for 12 hours, returning to 0° C. for 12 hours, and preservation at room temperature. As shown in FIG. 14C, no creases is caused after the preservation test and there is almost no change in the appearance.

An acrylic resin was used as the member 501 subjected to a preservation test. The same result was obtained when a glass epoxy resin was used instead of the acrylic resin under the same preservation test. It can be said that generation of creases is suppressed by the buffer plate 500. Note that the acrylic resin is preferable for the member 501 because the weight and cost of the glass epoxy resin are higher than those of the acrylic resin.

A flexible display panel is mounted on a member having a curved surface and formed of an acrylic resin with a buffer plate provided therebetween, so that a kawara display composed of a plurality of flexible display panels can be achieved.

REFERENCE NUMERALS 20 acrylic plate
100 display panel
101a display region
101b display region 103 light-transmitting layer
112 FPC
120 terminal electrode
120a region
132 protective substrate
153a element layer
153b element layer
155a region
155b region
156a region
156b region
157 bonding layer

The invention claimed is:

1. A display device comprising:
a first display panel comprising a light-emitting portion; and
a second display panel overlapping the first display panel, the second display panel comprising a light-emitting portion and a region transmitting visible light adjacent to the light-emitting portion, wherein a light-transmitting layer is provided between the region transmitting visible light of the second display panel and the light-emitting portion of the first display panel, and
wherein one of the first display panel and the second display panel is fixed to a member having a curved surface with a metal plate provided therebetween.

2. The display device according to claim 1,
wherein each of the first display panel and the second display panel has flexibility.

3. The display device according to claim 1,
wherein the light-transmitting layer comprises a first attachment layer on one side of the light-transmitting layer and a second attachment layer on the other side of the light-transmitting layer,
wherein the first attachment layer is attached to a substrate of the second display panel, and
wherein the second attachment layer is attached to a substrate of the first display panel.

4. The display device according to claim 1,
wherein the region transmitting visible light and a region of the light-emitting portion of the second display panel overlap the light-transmitting layer.

5. The display device according to claim 1,
wherein each of the first display panel and the second display panel comprises a substrate, a bonding layer, and an element layer.

6. The display device according to claim 1,
wherein the curved surface of the member has a radius of curvature of 780 mm, and
wherein an aluminum plate is used as the metal plate.

7. A display device comprising:
a first display panel comprising a light-emitting portion;
a second display panel overlapping the first display panel, the second display panel comprising a light-emitting portion and a region transmitting visible light adjacent to the light-emitting portion; and
a third display panel overlapping the first display panel and the second display panel, the third display panel comprising a light-emitting portion,
wherein a light-transmitting layer is provided between the region transmitting visible light of the second display panel and the light-emitting portion of the first display panel, and
wherein one of the first display panel, the second display panel, and the third display panel is fixed to a member having a curved surface with a metal plate provided therebetween.

8. The display device according to claim 7,
wherein each of the first display panel, the second display panel, and the third display panel has flexibility.

9. The display device according to claim 7,
wherein the light-transmitting layer comprises a first attachment layer on one side of the light-transmitting layer and a second attachment layer on the other side of the light-transmitting layer,
wherein the first attachment layer is attached to a substrate of the second display panel, and
wherein the second attachment layer is attached to a substrate of the first display panel.

10. The display device according to claim 7,
wherein the region transmitting visible light and a region of the light-emitting portion of the second display panel overlap the light-transmitting layer.

11. The display device according to claim 7,
wherein each of the first display panel, the second display panel, and the third display panel comprises a substrate, a bonding layer, and an element layer.

12. The display device according to claim 7,
wherein the curved surface of the member has a radius of curvature of 780 mm, and
wherein an aluminum plate is used as the metal plate.

13. A display device comprising:
a first display panel comprising a light-emitting portion; and
a second display panel overlapping the first display panel, the second display panel comprising a light-emitting portion and a region transmitting visible light adjacent to the light-emitting portion,
wherein a light-transmitting layer is provided between the region transmitting visible light of the second display panel and the light-emitting portion of the first display panel,
wherein the first display panel and the second display panel are detachably attached to each other with the light-transmitting layer, and
wherein a metal plate is on a rear surface of the first display panel, and
wherein the first display panel is fixed to a member having a curved surface with the metal plate therebetween.

14. The display device according to claim 13,
wherein each of the first display panel and the second display panel has flexibility.

15. The display device according to claim 13,
wherein the light-transmitting layer comprises a first attachment layer on one side of the light-transmitting layer and a second attachment layer on the other side of the light-transmitting layer,
wherein the first attachment layer is attached to a substrate of the second display panel, and
wherein the second attachment layer is attached to a substrate of the first display panel.

16. The display device according to claim 13,
wherein the region transmitting visible light and a region of the light-emitting portion of the second display panel overlap the light-transmitting layer.

17. The display device according to claim 13,
wherein each of the first display panel and the second display panel comprises a substrate, a bonding layer, and an element layer.

18. The display device according to claim 13,
wherein the curved surface of the member has a radius of curvature of 780 mm, and
wherein an aluminum plate is used as the metal plate.

* * * * *